US011494811B1

(12) United States Patent
Sharma et al.

(10) Patent No.: US 11,494,811 B1
(45) Date of Patent: Nov. 8, 2022

(54) ARTIFICIAL INTELLIGENCE PREDICTION OF HIGH-VALUE SOCIAL MEDIA AUDIENCE BEHAVIOR FOR MARKETING CAMPAIGNS

(71) Applicant: Isolation Network, Inc., Encino, CA (US)

(72) Inventors: Shantanu K Sharma, Rancho Santa Fe, CA (US); Yu-Chien Huang, Victoria (CA); James Parks, Enskededalen (SE); Daniel Cownden, Victoria (CA); Jia Wen Tian, Victoria (CA)

(73) Assignee: Isolation Network, Inc., Encino, CA (US)

( * ) Notice: Subject to any disclaimer, the term of this patent is extended or adjusted under 35 U.S.C. 154(b) by 0 days.

(21) Appl. No.: 17/679,954

(22) Filed: Feb. 24, 2022

(51) Int. Cl.
*G06Q 30/00* (2012.01)
*G06Q 30/02* (2012.01)
(Continued)

(52) U.S. Cl.
CPC ......... *G06Q 30/0276* (2013.01); *G06F 30/27* (2020.01); *G06Q 30/0205* (2013.01);
(Continued)

(58) Field of Classification Search
CPC ............... G06Q 30/02; G06Q 30/0205; G06Q 30/0204; G06Q 30/0202; G06Q 30/0254;
(Continued)

(56) References Cited

U.S. PATENT DOCUMENTS

2016/0071162 A1* 3/2016 Ogawa .................. G06Q 50/01 705/14.66
2017/0213243 A1* 7/2017 Dollard ............. G06Q 30/0249
(Continued)

OTHER PUBLICATIONS

Homann, L. A. (2021). Benchmarking recommender systems (Order No. 28946769). Available from ProQuest Dissertations and Theses Professional. (2607335281). (Year: 2021).*

*Primary Examiner* — William S Brockington, III
(74) *Attorney, Agent, or Firm* — Venable LLP

(57) ABSTRACT

A marketing analytics pipeline includes an opportunity detection analytics hub and a marketing platform, wherein the opportunity detection analytics hub is configured to use trend data reports from a consumption database to fit statistical models based on streaming consumption and interaction patterns of social media UGC (user generated content) and to send growth and re-engagement opportunities to a marketing action analytics hub, and wherein the marketing platform is configured to interact with the marketing action analytics hub to create targeted marketing campaigns based around high growth potential audiences. In a further aspect, the opportunity detection analytics hub includes an offline prediction model generation component and an online opportunity detection component that receives both current streaming consumption and social media UGC interaction data for a plurality of media IP assets and identifies opportunities from the combination of these two data sources that could not be detected if analyzed separately, inclusive of a case where significant changes are detected in social media UGC interaction patterns, but are not yet detected in streaming consumption.

3 Claims, 16 Drawing Sheets

(51) Int. Cl.
*G06F 30/27* (2020.01)
*G06Q 50/00* (2012.01)

(52) U.S. Cl.
CPC ..... *G06Q 30/0254* (2013.01); *G06Q 30/0269* (2013.01); *G06Q 50/01* (2013.01)

(58) Field of Classification Search
CPC ........... G06Q 30/0251; G06Q 30/0241; G06Q 30/0269; G06Q 30/0276; G06Q 50/01
See application file for complete search history.

(56) References Cited

U.S. PATENT DOCUMENTS

| | | | | |
|---|---|---|---|---|
| 2019/0102791 | A1* | 4/2019 | Park | G06F 16/24568 |
| 2019/0349619 | A1* | 11/2019 | Hou | H04N 21/4722 |
| 2020/0137429 | A1* | 4/2020 | Strosaker | H04N 21/2668 |

* cited by examiner

| Opportunity Ranking | Media Asset | Significant Change Detection Channels | Significant Change Prediction | GUI Messages |
|---|---|---|---|---|
| 1 | Maxx Cobbler's Smootherest | TikTok Total Views<br><br>Spotify Playlists | True | Growth has been Detected in Active TikTok Engagement, Growth in Active DSP Streaming is Predicted to Occur in the Following Days, and the Song is also Connecting with an Audience on Spotify's *Internet People* and Expected to Grow |
| 2 | The Mile Bender's Rawff Times | Active YouTube UGC Views | True | Growth has been Detected in Active UGC Views on YouTube, Growth in Active DSP Streaming is Predicted to Occur in the Following Days |
| 3 | Racso's<br><br>He Likes Another Girl | Apple Music Active Streaming<br><br>Spotify Active Streaming<br><br>Spotify Playlists<br><br>Active YouTube UGC Views | False | The Song is Continuing to Connect with an actively Engaged Audience on Multiple Retailers and is also Connecting with Active Audiences on YouTube Interacting with UGC |
| 4 | Headmo Kim's<br><br>MOPTP<br><br>(Remix) | Apple Music Active Streaming | False | The Song is Now Connecting with an Actively Engaged Audience on Apple Music |

Figure 9

ARTIFICIAL INTELLIGENCE PREDICTION OF HIGH-VALUE SOCIAL MEDIA AUDIENCE BEHAVIOR FOR MARKETING CAMPAIGNS

BACKGROUND

1. Technical Field

The field generally relates to the automatic detection of marketing opportunities, and the generation and execution of marketing campaigns, for media assets in the on-demand streaming market. The system and method primarily operate in the space between the platforms where the media are consumed by the user and the platforms where users can be reached.

2. Discussion of Related Art

Prior to the dominance of streaming consumption, the marketing efforts of media intellectual property (IP) asset managers and owners were focused on recent releases to drive one-off sales of singles and albums in a short window following release date. Currently, however, recurring streaming events, not purchases, are the primary monetizable events for media IP asset owners. Thus, there remains a need for systems and methods for determining how to best allocate promotional resources across the entirety of a media IP asset owner's catalog with the aim of driving recurrent streaming, not one-off purchases.

The recent rapid growth in interactions with user-generated content (UGC) on short-form video social media platforms has added increased complexity to this setting. Since engagement with media IP assets on these platforms is frequently unrelated to the media IP assets themselves, media IP asset managers/owners require a new system and method of determining the importance of the rapid growths in engagement displayed by the media IP assets on these platforms for the prioritization of promotional resources.

SUMMARY

An embodiment of the instant disclosure herein relates to the authorization of execution of targeted marketing campaigns for streaming media intellectual property (IP) assets, such as authorization by the owner or the manager of media assets. Streaming data of consumers of media assets, and interactions of social media users with user generated content (UGC), are documented and compiled into trend reports, which are provided to a marketing analytics pipeline.

The marketing analytics pipeline creates marketing campaigns for media IP asset managers and/or owners, which are presented to them for modification and authorization to execute the marketing campaigns.

In one aspect, the marketing analytics pipeline is comprised of an opportunity detection analytics hub and a marketing platform. The opportunity detection analytics hub is configured to use trend data reports from a consumption database to fit statistical models based on streaming consumption and social media user-generated content (UGC) interaction patterns of an entirety of distributed media IP assets on a regular cadence and send growth and re-engagement opportunities on to a marketing action analytics hub where high growth potential audiences for these opportunities can be identified. The marketing platform is configured to interact with the marketing action analytics hub and to create targeted marketing campaigns based around the high growth potential audiences, the marketing platform further being configured to suggest specific marketing actions to the media IP asset managers/owners, wherein the marketing actions are designed for delivery to the high growth potential audiences on appropriate marketing channels via the targeted marketing campaigns.

In a further aspect, the opportunity detection analytics hub is comprised of an offline prediction model generation component and an online opportunity detection component that receives both current streaming consumption and social media UGC interaction data for a plurality of media IP assets and identifies opportunities from the combination of these two data sources that could not be detected if analyzed separately, inclusive of a case where significant changes are detected in social media UGC interaction patterns, but are not yet detected in streaming consumption.

Embodiments contemplated herein include any and all of methods, apparatus, tangible computer-readable media and others, related to the description provided herein.

BRIEF DESCRIPTION OF THE DRAWINGS

Further objectives and advantages will become apparent from a consideration of the description, drawings, and examples.

FIG. 9 is an example of a GUI for a list of media assets and the marketing opportunity messages that may be presented to a manager and/or owner of a media IP asset.

DETAILED DESCRIPTION

Figure 1:
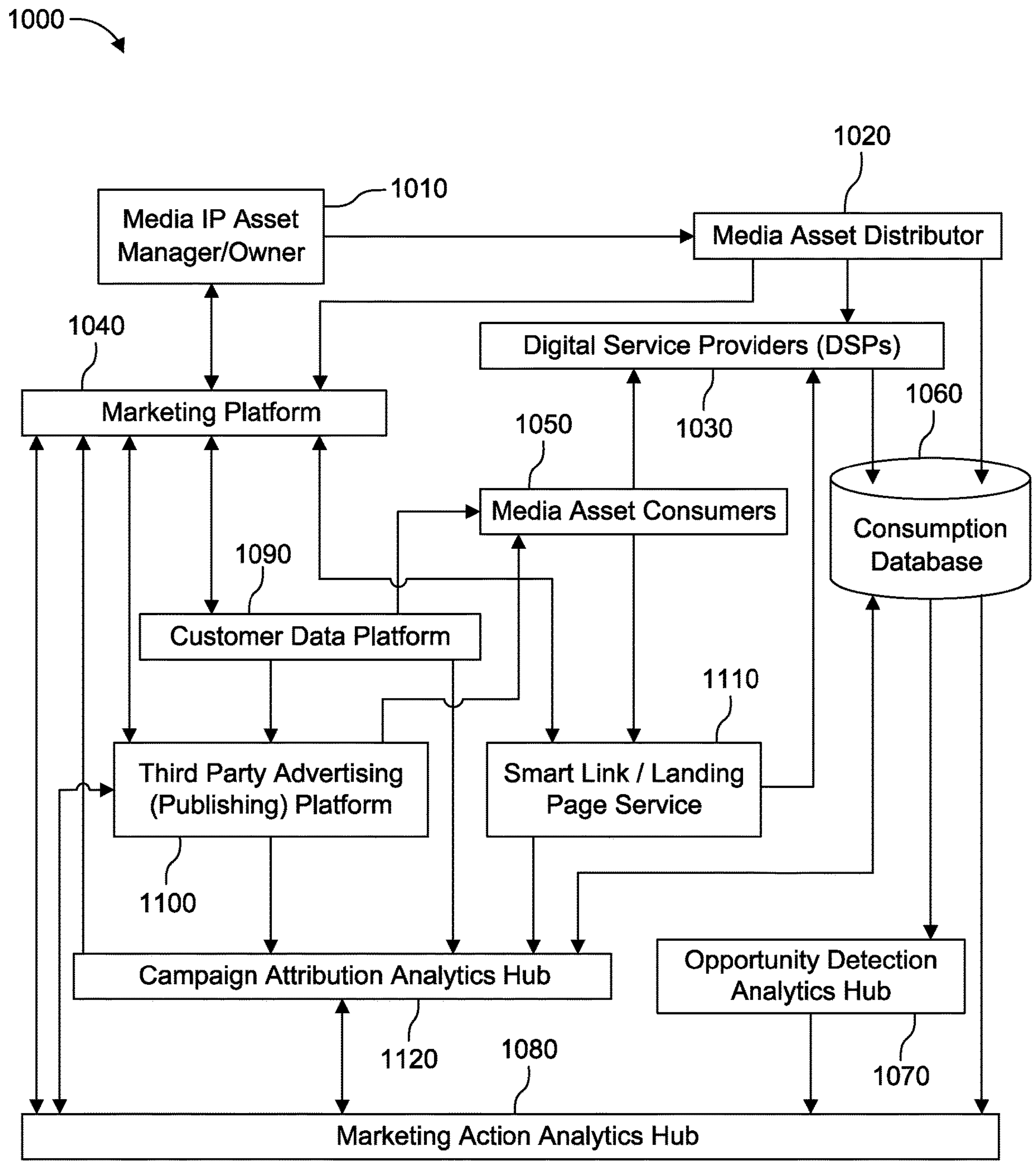
FIG. 1 shows a marketing analytics pipeline according to some embodiments of the disclosure.

Some embodiments of the current disclosure herein are discussed in detail below. In describing embodiments, specific terminology is employed for the sake of clarity. However, the disclosure herein is not intended to be limited to the specific terminology so selected. A person skilled in the relevant art will recognize that other equivalent components can be employed and other methods developed without departing from the broad concepts of the current disclosure herein. Any reference cited anywhere in this specification, including the Background and Detailed Description sections, is incorporated by reference in its entirety.

The recorded music industry has come to be dominated by on-demand streaming services (referred to as digital service providers (DSPs), e.g., Spotify, Apple Music). The dominant DSPs, as part of their contracts with the IP holders who license their content to these DSPs, provide detailed transaction-level reporting of all streaming events. This data provides unprecedented access and insight into how media asset consumers are engaging with specific IP, across multiple retail platforms.

DSPs charge consumers recurring subscription fees (and in some cases one-time fees or show advertisements) in exchange for access to large libraries of music, available on demand. This leads to fundamentally different patterns of music consumption than those found under previous purchase-based music consumption models, characterized by increased exploration and time spent engaging with music.

In contrast to DSP subscribers who pay fees independent of usage, DSPs predominantly pay media IP asset owners based on their IP's share of all streams on platform within a regional market over a given subscription billing period (typically monthly). Hence, a media IP asset owner's revenue is maximized when more media asset consumers stream their content more frequently than other content on a streaming platform. An additional consequence of this payment structure is that media assets generate revenues gradually over time as they are continually streamed by media asset consumers, not upfront in one-off purchases, as was characteristic of both physical and download media consumption.

Prior to the dominance of streaming consumption, the marketing efforts of media IP asset managers/owners were naturally focused on recent releases to drive one-off sales of singles/albums in the short window following release date. However, now that recurring streaming events, not purchases, are the primary monetizable events for media IP asset owners, increasing long term engagement for their entire catalog of media assets, regardless of release date, is now the focus. How to best allocate promotional resources across the entirety of a media IP asset owner's catalog with the aim of driving recurrent streaming, not one-off purchases, is a problem which some embodiments of the present disclosure addresses.

Reference is made to prior U.S. Pat. No. 10,755,291, "Artificial Intelligence Automation of Marketing Campaigns", which describes a method and system of advertising media IP assets to third-party advertising platform users based on the reporting received from DSPs (e.g., Spotify, Apple Music, YouTube, etc.) and prior U.S. Pat. No. 11,113,707, "Artificial intelligence identification of high-value audiences for marketing campaigns", which describes a method and system of identifying high-value audiences for which to advertise media IP assets on third-party advertising platforms based on the reporting received from DSPs as part of a marketing action analytics hub component in a marketing analytics pipeline. To identify worthwhile marketing opportunities, these methods employ an opportunity detection analytics hub that uses statistical models to detect statistically significant shifts in the streaming consumption patterns of a media IP asset by constantly scanning new consumption data from a consumption database as they become available. Media IP assets experiencing significant changes in their streaming consumption patterns are then passed on to a sub-module for further analysis.

This method and system of identifying significant changes in streaming consumption patterns for media IP assets also applies to the setting of social media platform interaction patterns. However, the external events producing these significant changes in social media platform user interactions are frequently unrelated to the associated media IP assets. As such, it is beneficial to provide a new approach for prioritizing worthwhile opportunities for promotion and suppressing opportunities that are not worthwhile in the marketing analytics pipeline.

This new approach has been motivated by the dramatic increase in popularity of short-form video content on social media platforms. In this setting social media platform users interact (e.g., view, create, comment, etc.) with user generated content (e.g., short-form user created videos) often in exchange for being served ads. Dominant platforms in this space include TikTok which expanded from a monthly active userbase of 54 million active users in 2018 to over one billion active users in September 2021 (for example, see newsroom.tiktok.com/en-us/1-billion-people-on-tiktok). During this period YouTube (YouTube Shorts, www.theverge.com/2021/2/17/22286286/youtube-shorts-us-rollout-product-features-updates-chapters-monetization-neal-mohan) and Instagram (Reels, techcrunch.com/2019/11/12/instagram-reels/) also released platforms for social media platform users to create and interact with short-form videos in addition to previously existing platforms (e.g., Triller, etc.) in this space.

This rapid growth in short-form video interactions has resulted in a huge shift in the discovery and engagement behavior of streaming media asset consumers. Short-form video social media platforms prioritize not just passive forms of engagement (e.g., views, likes, etc.) but active forms of engagement (e.g., video creations, etc.) as well. In addition, short-form video social media platforms prioritize the inclusion of sound recordings in both a primary (e.g., lip-synching to a sound recording) and background (e.g., a cat video using the sound recording as background music) capacity. That is, users on these platforms interact with the content (e.g., create videos featuring user generated content) that contain the media IP assets (e.g., sound and video recordings) but where the media IP asset is not necessarily the primary focus of the user's engagement with the user generated content. It is this distinction that motivates the disclosure herein to identify significant changes in UGC interactions on social media platforms and classify these significant changes with respect to their potential to result in significant growth on streaming DSPs and generate worthwhile marketing opportunities for promotion by media IP asset owners/managers.

On social media platforms, UGC interactions associated with media IP assets may not be reported at a transaction-level, only at an aggregate-level, to the media IP asset distributor. However, the aggregate-level trend data reporting can be ingested and processed in the consumption database analogously to the streaming trend reporting data from DSPs.

Opportunities for media IP assets are often indicated by sudden increases in engagement on streaming DSPs. Engagement context and anomalous streaming patterns are both considered when determining which sudden increases in engagement on streaming DSPs are associated with opportunities to pass on to the marketing action analytics hub for further promotion. On social media platforms however, the media IP assets may not necessarily be the primary reasons for the sudden increases in engagement with the UGC as these increases in UGC engagement can be frequently unrelated to the media IP assets themselves. Additional analysis is required to determine if these sudden increases in UGC engagement indicate opportunities for increased monetization on streaming DSPs.

On the other hand, when a media IP asset is a primary driver of engagement with the UGC, the discovery and/or re-engagement with the media IP asset within the context of the UGC on the social media platform is often accompanied by highly valuable discovery and re-engagement behavior by media IP asset consumers on streaming DSPs with the corresponding media IP asset. Predicting which increases in UGC engagement are likely to result in increases in streaming DSP consumption requires a new extension to the existing opportunity detection analytics hub within the marketing analytics pipeline.

Marketing Analytics Pipeline

FIG. 1 is a schematic of a marketing analytics pipeline 1000 according to some embodiments of the present disclosure. As shown in FIG. 1, the marketing analytics pipeline 1000 in this embodiment includes Media IP Asset Managers/Owners 1010, Media Asset Distributor 1020, Digital Service Providers (DSPs) 1030, Marketing Platform 1040, Media Asset Consumers 1050, Consumption Database 1060, Opportunity Detection Analytics Hub 1070, Marketing Action Analytics Hub 1080, Customer Data Platform 1090, Third-Party Advertising (Publishing) Platform 1100, Smart Link/Landing Page Service 1110, and Campaign Attribution Analytics Hub 1120. Each component is responsible for different and sometimes overlapping tasks, and each is discussed below. Some embodiments need not include all components, and need not include all of the tasks or the specific distribution of tasks as described herein.

Briefly, according to one aspect described herein, the marketing analytics pipeline 1000 receives transaction-level trend reporting of media IP assets distributed on DSPs 1030. The marketing analytics pipeline 1000 includes an opportunity detection analytics hub 1070 configured to monitor consumption profiles of the media IP assets and automatically detect growth and re-engagement opportunities as they occur. The marketing analytics pipeline 1000 includes a marketing action analytics hub 1080 configured to receive the growth and re-engagement opportunities from the opportunity detection analytics hub 1070, or from the marketing platform 1040 directly, and to identify high growth potential audiences using predictive models of engagement. The marketing analytics pipeline 1000 includes a marketing platform 1040 configured to interact with the marketing action analytics hub 1080 and to create marketing campaigns based around the high growth potential audiences and suggest marketing actions to media IP asset managers and owners 1010 to deliver to the high growth potential audiences on appropriate marketing channels via targeted marketing campaigns. The marketing analytics pipeline 1000 includes a campaign attribution analytics hub 1120 configured to use data from a consumption database 1060, the marketing platform 1040, a customer data platform 1090, and third-party advertising platforms 1100 to accurately attribute the effect of the marketing campaigns.

Figure 2:
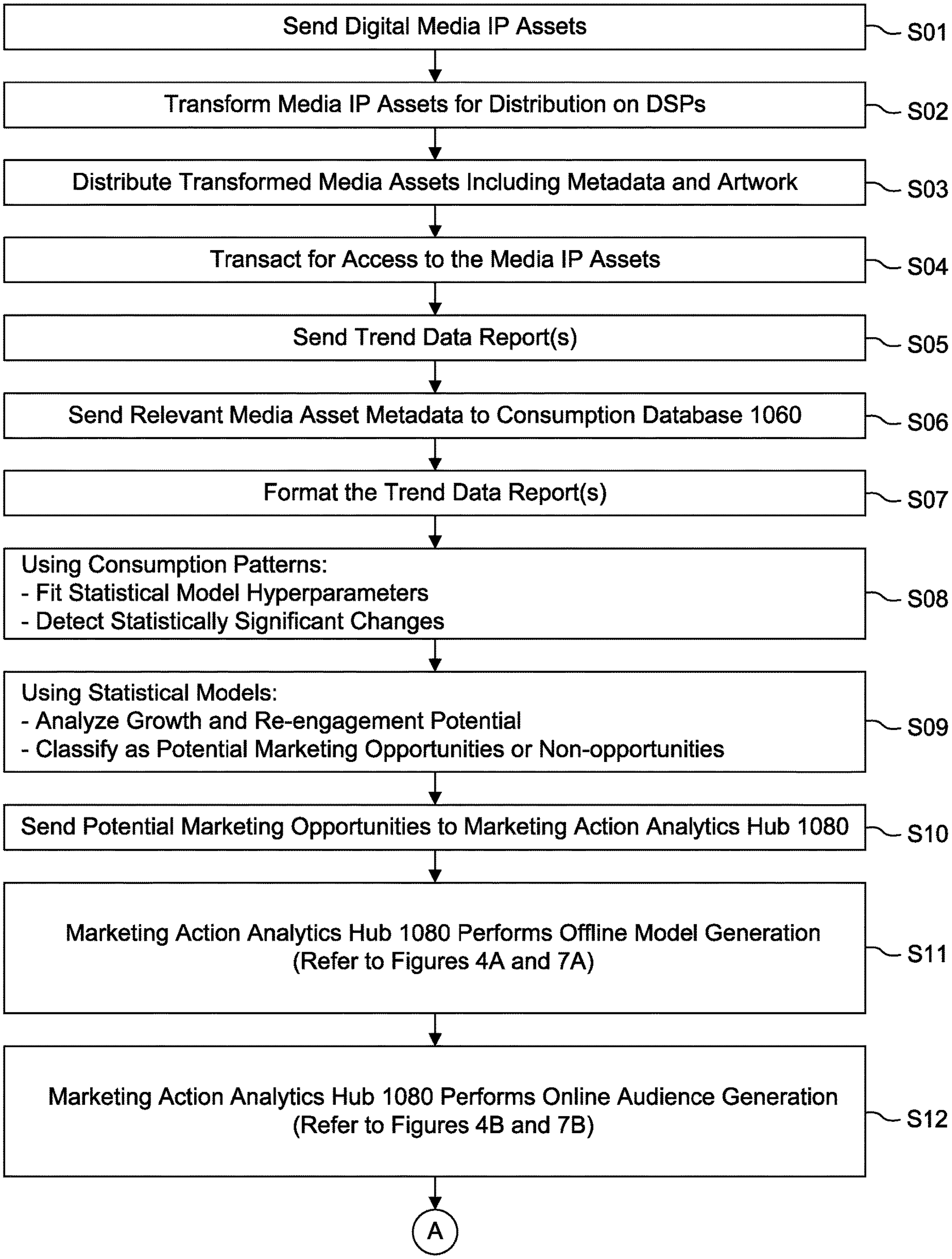
FIG. 2 is a flow diagram depicting a plurality of steps executed by the marketing analytics pipeline according to some embodiments of the disclosure.
Figure 2:
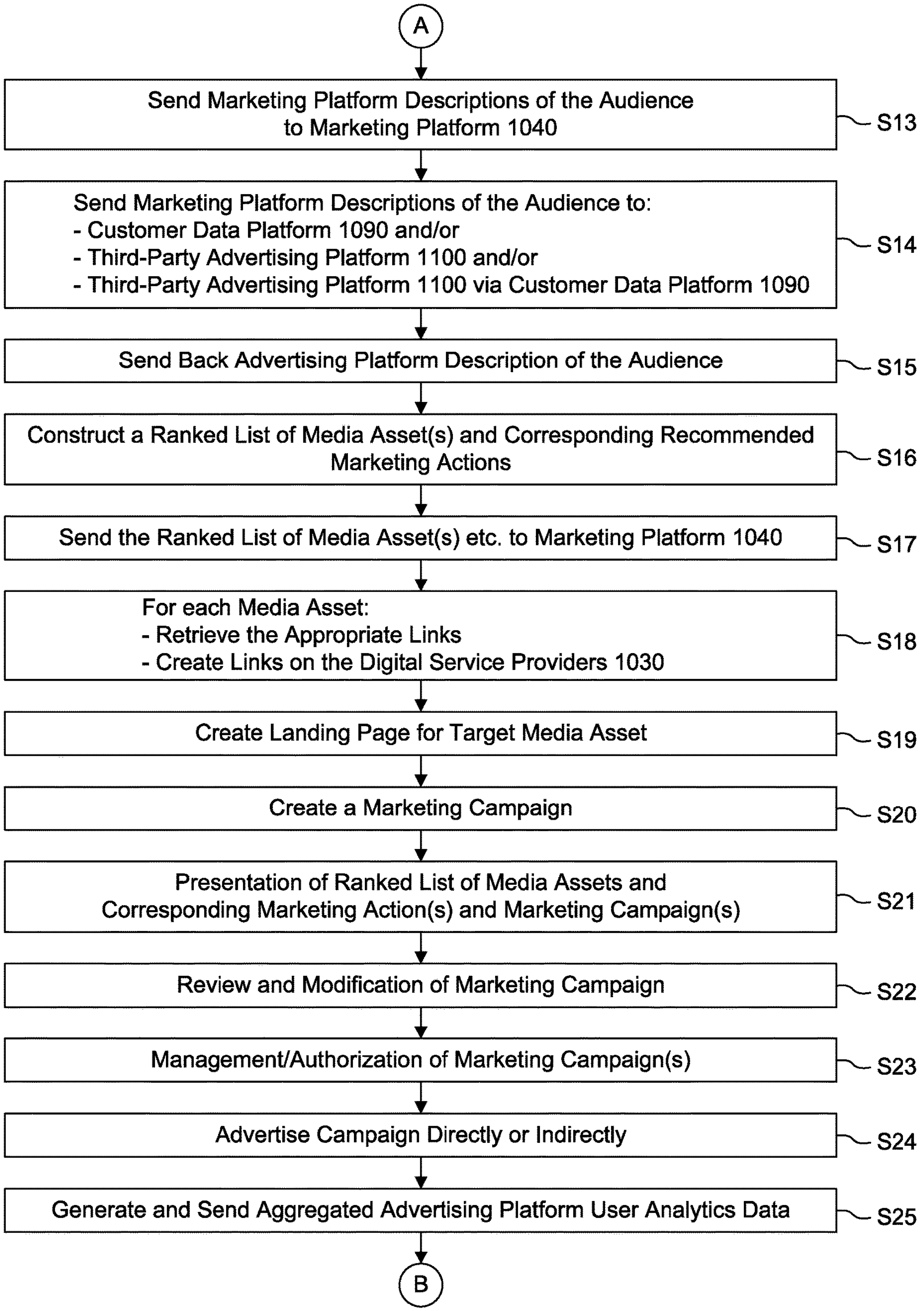
Figure 2:
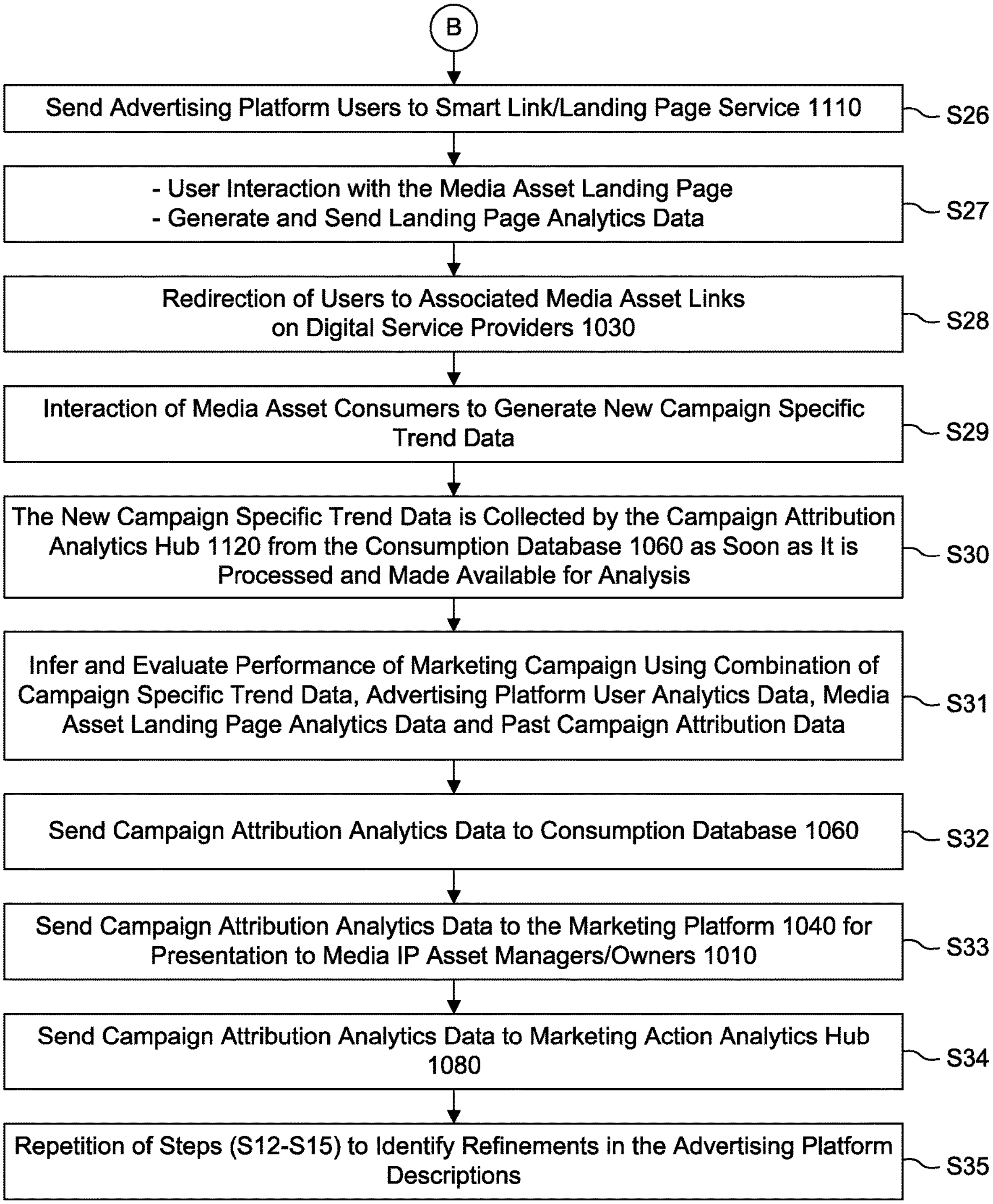

In more detail, FIG. 2 is a flow diagram depicting a plurality of steps executed by the marketing analytics pipeline 1000 according to some embodiments of the disclosure. The marketing analytics pipeline 1000 describes the process from the consumption of media assets on DSPs to the detection of marketing opportunities for media assets to the generation of target audiences for the media assets to the presentation of marketing actions to media asset managers/owners 1010 to the delivery of advertisements to the audiences off of streaming platforms to the attribution of marketing actions in the consumption database 1060 from said marketing actions.

In step S01 of the marketing analytics pipeline 1000, media IP asset managers/owners 1010 send digital media IP assets along with their associated metadata (e.g., audio, video, artwork, etc.) to a digital media asset distributor 1020. In step S02, the media IP assets and their associated metadata are then transformed into appropriate formats for distribution on DSPs 1030. In a specific embodiment of this process, promotional advertisement material, e.g., album art, sample sound clips, etc., are also submitted along with the media IP assets by the media IP asset managers/owners 1010 to the media asset distributor 1020.

In step S03, the media asset distributor 1020 then sends the transformed media assets, metadata and artwork to DSPs 1030 (e.g., Apple Music, Pandora, Spotify, YouTube, etc.), and to a marketing platform 1040. In step S04, DSPs 1030 collect subscription or one-time fees or serve advertisements to consumers in exchange for access to the audio/visual media IP assets sent via a media asset distributor 1020 with the explicitly contracted permission of the owners of said media IP assets 1010. The interaction between the media asset consumers 1050 and the DSPs 1030 is documented and compiled in a transaction-level trend data report.

In step S05, the trend data report is sent from the DSPs 1030 to a consumption database 1060 where it is ingested and processed on a regular cadence typically lagging the actual consumption events by a few days. The media asset distributor 1020 sends the relevant media asset metadata to the consumption database 1060 in step S06. In step S07, the consumption database 1060 uses the media asset metadata to format the trend data reports so that consumption patterns across multiple DSPs 1030 can be analyzed together.

In step S08, an opportunity detection analytics hub 1070 uses the transaction-level trend data reports in the consumption database 1060 to tune statistical model hyperparameters. The opportunity detection analytics hub 1070 is comprised of two major components: an offline prediction model generation component 1076 (not to be confused with the Offline Model Generation Component 1820 of the marketing action analytics hub 1080) and an online opportunity detection component 1075. For tuning of the statistical model hyperparameters, the opportunity detection analytics hub 1070 uses the transaction-level trend data reports in the consumption database 1060 to tune statistical model hyperparameters based on the streaming consumption and UGC interaction patterns of the entirety of media assets in an offline setting on a regular cadence (e.g., weekly, monthly) in the offline prediction model generation component 1076. In the online opportunity detection component 1075 of the opportunity detection analytics hub 1070 the transaction-level trend data reports in the consumption database 1060 are used to automatically detect statistically significant changes in the streaming consumption and UGC interaction patterns for the entirety of media assets in an online setting (i.e., as soon as the trend data report is processed by the consumption database 1060 and made available for analysis).

In step S09, the opportunity detection analytics hub 1070 uses statistical models to analyze the growth and re-engagement potential for the media assets exhibiting or predicted to exhibit significant changes in their consumption patterns and classifies them as potential marketing opportunities or non-opportunities. Media assets classified as non-opportunities do not proceed further in the marketing analytics pipeline 1000.

The opportunity detection analytics hub 1070 automatically sends those media assets classified as potential marketing opportunities to a marketing action analytics hub 1080 in step S10.

In step S11, the marketing action analytics hub 1080 performs offline model generation which is described below in greater detail later with reference to FIGS. 4B and 7B.

In step S12, the marketing action analytics hub 1080 performs online audience generation which is described below in greater detail later with reference to FIGS. 4A and 7A.

In step S13, the marketing action analytics hub 1080 sends the marketing platform descriptions of the audience for the media asset to the marketing platform 1040, as shown at step S1850 of FIG. 7A, which is discussed in more detail below. In step S14, the marketing platform 1040 then sends the marketing platform descriptions of the audience for the media asset to one or more of the following: a customer data platform 1090 to construct an advertising platform description of the audience for the media asset; a third-party advertising platform 1100 (e.g., Google Ads, Facebook, Instagram) to construct an advertising platform description of the audience for the media asset; or a customer data platform 1090 which transforms the description of the media asset before sending the transformed description to a third-party advertising platform 1100 to construct an advertising platform description of the audience for the media asset.

In step S15, the advertising platform description of the audience for the media asset is sent back to the marketing platform 1040 and on to the marketing action analytics hub 1080 from either a customer data platform 1090 or a third-party advertising platform 1100.

In step S16, for (possibly multiple) media assets owned by the media IP asset owner 1010, the marketing action analytics hub 1080 uses statistical models, each media asset's high growth potential audience and an advertising platform description of that audience to construct a ranked list of media assets and corresponding recommended marketing actions based on their potential cost and estimated return on investment. Media assets which do not generate corresponding marketing actions or advertising platform descriptions do not proceed further in the marketing analytics pipeline 1000.

In step S17, the marketing action analytics hub 1080 sends the ranked list of media assets and corresponding recommended marketing actions and their advertising platform descriptions of the audiences for the media assets in the list as well as a possible ranked list of auxiliary media assets to the marketing platform 1040.

In step S18, for each media asset in the ranked list of media assets and corresponding recommended marketing actions, the marketing platform 1040 uses application programming interfaces (APIs) of the DSPs 1030 and the associated metadata for the media asset to retrieve the appropriate links for the media asset on the DSPs 1030, and to create links on the DSPs 1030 that (in addition to the target media asset) also include the highly ranked auxiliary media assets from the ranked list of auxiliary media assets (e.g., playlist, radio station) in a specific embodiment of this process. These links are then retrieved from the DSPs 1030 by the marketing platform 1040.

In step S19, for each target media asset in the ranked list of media assets and corresponding recommended marketing actions, the marketing platform 1040 uses APIs of smart link/landing page services 1110 (e.g., Feature.fm, Linkfire) along with the associated metadata for the media asset and the appropriate links on DSPs 1030 to create a landing page for the target media asset.

In step S20, for each target media asset and corresponding marketing action in the ranked list, the marketing platform 1040 uses APIs of the third-party advertising platforms 1100 as well as their associated metadata, landing pages and advertising platform descriptions of the potential growth audience for the media asset to create a marketing campaign. In step S21, the ranked list of media assets and corresponding marketing actions and marketing campaigns is presented by the marketing platform 1040 to the media IP asset managers/owners 1010 in a graphical user interface (GUI) or through an alert notification. The marketing platform 1040 enables media IP asset managers/owners 1010 to review and modify the marketing campaign in step S22.

In step S23, the GUI in the marketing platform 1040 also enables media IP asset managers/owners 1010 to manage funds, set budgets and store promotional advertisement material for marketing campaigns. Media IP asset managers/owners 1010 are also presented with the option to authorize and execute marketing campaigns. If the media IP asset managers/owners 1010 do not execute the marketing campaign, then it does not proceed further in the marketing analytics pipeline 1000. Additionally, media IP asset managers/owners 1010 can also pre-authorize the execution of campaigns exceeding a pre-determined threshold of anticipated cost efficacy.

In step S24, the marketing platform 1040 executes the marketing campaign by either advertising the campaign to users on third-party advertising platforms 1100, or by advertising the campaign directly to users via a customer data platform 1090 in a specific embodiment of this process. In step S25, advertising platform users interact with the marketing campaign which generates aggregated advertising platform user analytics data that is sent either through a third-party advertising platform 1100 or customer data platform 1090 to a campaign attribution analytics hub 1120.

In step S26, the marketing campaign advertisement includes a call-to-action to consume the associated media asset on DSPs 1030 which sends the advertising platform users to the corresponding media asset landing page generated and hosted by the smart link/landing page service 1110. Advertising platform users interact with the media asset landing page which generates landing page analytics data that is sent to the campaign attribution analytics hub 1120 in step S27. In step S28, advertising platform users interact with the media asset landing page and are redirected to the associated media asset links on DSPs 1030. Advertising platform users that are not media asset consumers 1050 of the appropriate DSP 1030 do not proceed further in the marketing analytics pipeline 1000.

In step S29, media asset consumers 1050 interact with media asset links on the corresponding DSPs 1030 which generate new campaign specific trend data that is then processed by the consumption database 1060. The new campaign specific trend data is collected by the campaign attribution analytics hub 1120 from the consumption database 1060 as soon as it is processed and made available for analysis in step S30.

In step S31, the campaign attribution analytics hub 1120 combines the campaign specific trend data, advertising platform analytics data, media asset landing page analytics data and past campaign attribution data to infer and subsequently evaluate the performance of the marketing campaign. The campaign performance evaluation generates campaign attribution analytics data for the marketing campaign. In a specific embodiment of this process the campaign attribution analytics hub 1120 evaluates the performance by attributing how many consumers were reached by the marketing campaign and their rate of engagement with the target assets.

In step S32, the campaign attribution analytics hub 1120 sends the campaign attribution analytics data to the consumption database 1060 to be used to evaluate possible future marketing campaigns. In step S33, the campaign attribution analytics hub 1120 also sends the campaign attribution analytics data to the marketing platform 1040 where the evaluation is presented to the media IP asset managers/owners 1010 in a GUI or through an alert notification.

In step S34, the marketing platform 1040 sends the campaign attribution analytics data to the marketing action analytics hub 1080. In step S35, the campaign attribution analytics data may be used by the marketing action analytics hub 1080 and marketing platform 1040 by repeating steps S12-S15 to inform any necessary refinements in the advertising platform descriptions of the potential growth audience for the media asset which conditional on any changes to the audience description updates the current marketing campaign in the marketing platform 1040.

Opportunity Detection Analytics Hub 1070

Briefly, according to one aspect described herein, the opportunity detection analytics hub 1070 is configured to monitor consumption and interaction profiles of media IP assets and automatically detect growth and re-engagement opportunities in an online setting as soon as they occur, including using transaction-level trend data reports from the consumption database 1060 to fit statistical models based on consumption and interaction patterns of an entirety of distributed media IP assets in an offline setting on a regular cadence.

Figure 3A:
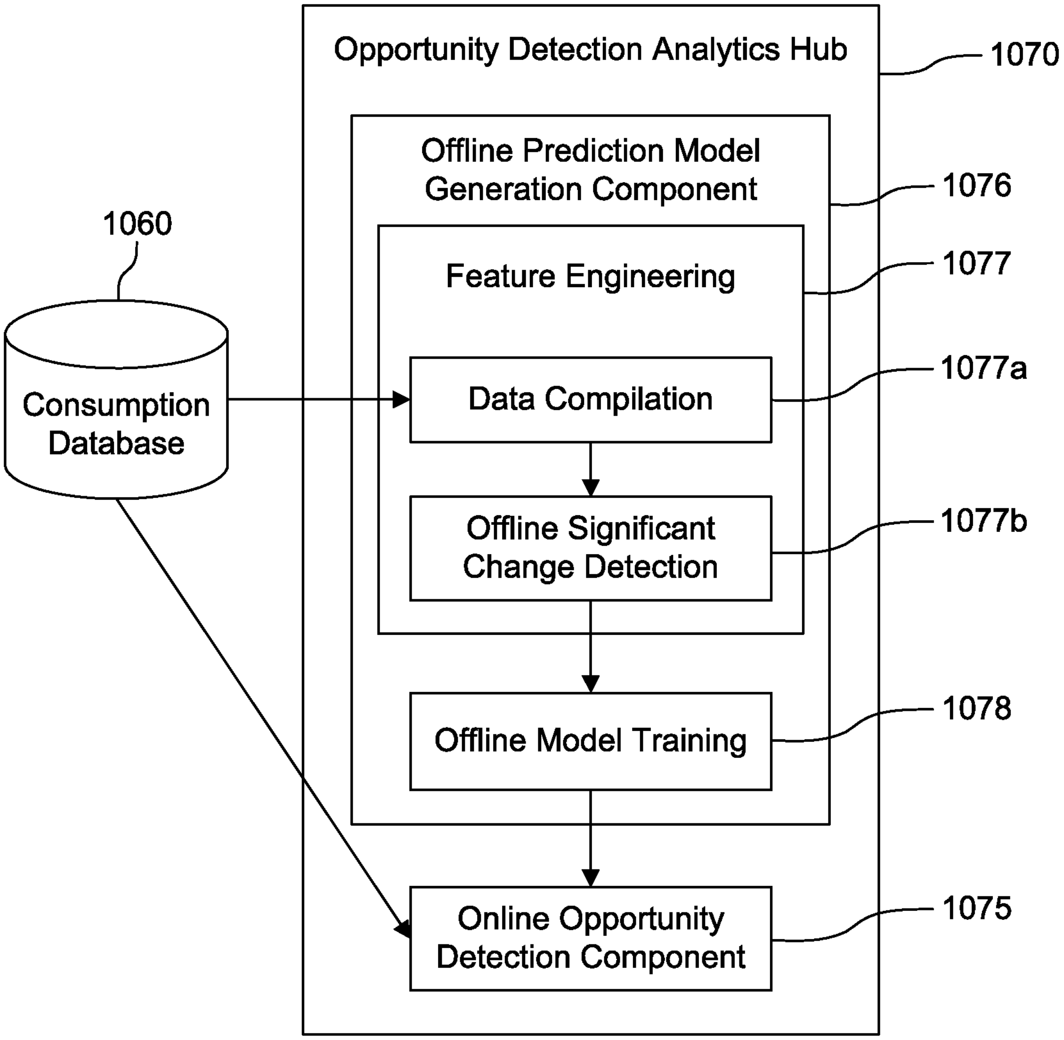
FIGS. 3A and 3B are schematics showing additional details of an opportunity detection analytics hub according to some embodiments of the disclosure, in which FIG. 3A highlights components of an offline prediction model generation component, and in which FIG. 3B highlights components of an online opportunity detection component.
Figure 3B:
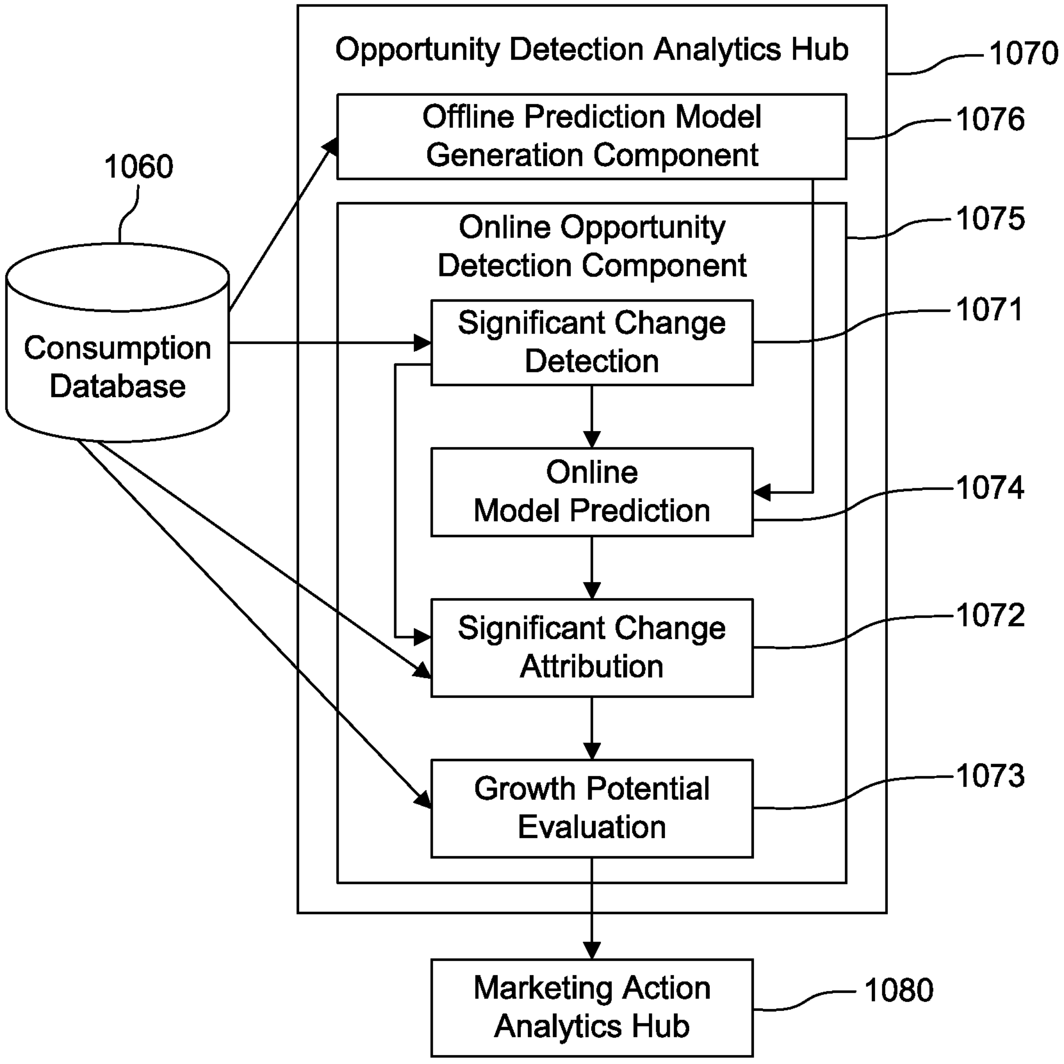

In more detail, additional figures herein describe some embodiments of the marketing analytics pipeline 1000 and process illustrated in FIGS. 1 and 2. FIGS. 3A and 3B are schematics showing additional details of the opportunity detection analytics hub 1070 according to some embodiments of the disclosure. In a specific embodiment of the process, the opportunity detection analytics hub 1070 uses statistical models to detect statistically significant shifts in the streaming consumption and UGC interaction patterns of a media asset by constantly scanning new consumption data from the consumption database 1060 as it becomes available (significant change detection 1071). Media assets experiencing significant changes in their streaming consumption patterns are then passed on to a sub-module (significant change attribution 1072) for further analysis. In contrast significant shifts in UGC interactions associated with a media asset are then passed on to the online model prediction component 1074 where the compiled and transformed UGC interaction data are analyzed. This component is described in greater detail below and detailed in FIGS. 3A and 3B.

The opportunity detection analytics hub 1070 uses a statistical model along with additional data from the consumption database 1060 to determine the proximal causes of change in streaming consumption and UGC interactions (significant change attribution 1072). The opportunity detection analytics hub 1070 (growth potential evaluation 1073) uses a statistical model applied to additional data from the consumption database 1060 according to the proximal causes of change identified by (significant change attribution 1072) to evaluate the potential marketing opportunity of the media asset. Media assets classified as having opportunities are passed along to the marketing action analytics hub 1080.

In a specific embodiment of the system and process schematically illustrated in FIG. 3B, significant change detection 1071 monitors media assets in the form of sound recordings, lyrics/album art videos, and/or music videos and scans for significant changes in their streaming consumption patterns (i.e. significant changes in their daily stream count time series) and monitors media assets in the form of user-generated audio and video recordings for significant changes in their interaction patterns (i.e. significant changes in their daily interaction count time series). The total stream counts are computed daily for all distributed DSPs for sound (e.g., Spotify, Apple Music, Pandora, Amazon, etc.) and video recordings (e.g., YouTube, Vevo, etc.) and the total interaction counts (e.g., likes, comments, views) are computed daily for all UGC associated with distributed media IP assets on social media platforms (e.g., TikTok, YouTube, etc.).

Significant changes in consumption or interaction patterns are called periods of significant change and are detected according to a model of daily stream or interaction counts respectively. In general, the model of daily counts is characterized by its ability to detect periods of significant change accurately and efficiently as soon as they occur. This is achieved through a model that is both trained and run online on each media asset individually across all DSPs and engagement contexts as well as social media platforms and UGC interaction contexts. The model learns the consumption and interaction patterns of media assets by accommodating for the strong day of week effect present in both streaming media consumer behavior and social media platform user behavior and adapting to the underlying distributions so that when statistically significant deviations from typical consumption or interaction patterns occur, they are detected as soon as the data is available. Additionally, the model is characterized by its ability to provide confidence intervals for the most probable future consumption or interaction patterns of media assets based on their past consumption or interaction patterns rather than simple point estimates respectively. The model explicitly estimates the growth rate, and it uses this estimate to identify periods of significant change. Since only the hyperparameters are tuned on global consumption and interaction patterns, applying the model to the consumption and interaction patterns of each individual media asset does not depend on global consumption or interaction patterns, which enables the model to be parallelized for efficient computation. This model detects both gradual and rapid changes in consumption and interactions.

In the embodiment described herein, the modeling of daily stream and interaction counts proceeds by modeling daily counts y as noisy measurements of a latent multivariate state vector z consisting of level l, trend b, and periodic offset s components $s_t$ which model day of week variances in stream counts at time t. The latent state propagates forward in time via a linear Markov process, i.e., $z_t=A_t z_{t-1}+\varepsilon_t \epsilon_t$, while its connection to new data is modeled as $y_t=B_t z_t+\eta_t$. Here, t and t−1 refer to current and prior states, respectively, $A_t$ is a state transition matrix that propagates vector z forward in time from t−1 to t, $B_t$ is a matrix that connects new data y to vector z at time t, $\varepsilon_t$ is a vector of scaling parameters at time t, and $\epsilon_t$ and $\eta_t$ are univariate Gaussian noise terms at time t. The full posterior distribution of the state is propagated forward in time by employing a dynamic Bayesian network, which recursively updates the state distribution with each new data point as $$p(z_t|y_{0:t}) \propto p(y_t|z_t)\int p(z_t|z_{t-1})p(z_{t-1}|y_{0:t-1})dz_{t-1}$$

wherein each p( ) represents a probability function of an event occurring. Future state distributions in the absence of new data are then predicted by computing $$p(z_{t+T}|y_{0:t}) = \int p(z_{t+T}|z_{t+T-1})p(z_{t+T-1}|z_{t+T-2}) \ldots p(z_t|y_{0:t}) dz_{t+T-1}dz_{t+T-2} \ldots dz_t.$$

In this specific embodiment, rapid changes in stream and interaction counts (changes occurring on the same time scale that the data is sampled) are detected by recursively calculating the probability that the current state distribution is equivalent to the predicted one based on previous data. Moreover, explicitly modeling the posterior distribution of the trend b enables the detection of gradual significant changes by recursively calculating the probability that b significantly deviates from zero.

For consumption on streaming DSPs, once a statistically significant change in the total stream count has been detected, significant change attribution 1072 is then used to determine the proximal cause(s) of the period of significant change. For UGC interactions on social media platforms, the detection of significant growth in total interaction counts must be first analyzed by the online model prediction component 1074 before continuing with significant change attribution 1072.

Additional engagement metrics in the trend reporting are used to determine the proximal causes of a period of significant change. Daily stream and interaction counts are separated into their individual retailer daily stream and interaction counts as well as further separated into streaming engagement and interaction contexts (where the trend data is available for a DSP or social media platform). For a sound recording the streaming and interaction contexts are separated into two main categories: active streams/interactions (e.g., streams from active search or collection, like and creation interactions) and passive streams/interactions (e.g., streams from editorial or algorithmic playlists or radio, views of UGC from playlists or algorithmic recommendations). Additionally, passive streams are further separated into the specific playlists and radio stations constituting the overall passive streams. Significant change attribution 1072 uses these engagement metrics to inform a probabilistic model to attribute the on-platform causes of the period of significant change. For periods of significant change attributed to active streams or UGC interactions, additional information (e.g., news articles, viral events) may be required to attribute the off-platform activity causing the period of significant change.

Media assets exhibiting significant changes in their streaming consumption patterns or predicted to exhibit significant growth in their active streaming consumption patterns by the online model prediction component 1074 are then sent to the growth potential evaluation component 1073 to be classified as either potential marketing opportunities with associated marketing campaign goals or non-opportunities using a statistical model applied to additional engagement metrics in the trend reporting. Key engagement metrics used in this model include the passive to active conversion rate, the search conversion rate, and the engagement drop off rate. The passive to active conversion rate determines the proportion of media asset consumers in a given time window that streamed a sound recording in a passive context and then went on to stream again in an active context. The search conversion rate determines the proportion of media asset consumers in a given time window that streamed a sound recording for the first time from active search and then streamed actively again from their collection. The engagement drop off rate determines the rate at which engaged consumers stop engaging with the media asset. In a specific embodiment each of these key engagement metrics are estimated from aggregated population data.

The opportunity detection analytics hub 1070 passes the media assets classified as opportunities and their associated marketing campaign goals along to the marketing action analytics hub 1080.

Offline Prediction Model Generation Component 1076

The offline prediction model generation component 1076 is comprised of a feature engineering component 1077 and an offline model training component 1078. The feature engineering component 1077 is itself comprised of a data compilation subcomponent **1077*a* and offline significant change detection subcomponent 1077*b***.

Associated with each media IP asset are metadata supplied to the media asset distributor 1020 by the media IP asset managers/owners 1010. On a regular cadence (e.g., weekly, monthly) media IP assets in the consumption database 1060 are sent to the offline prediction model generation component 1076. Here, statistical models of predicting DSP engagement are trained offline on a regular cadence (e.g., weekly, monthly) in an offline model training component 1078. To accommodate size and speed constraints on the generation of models for use in the online model prediction component 1074, only the UGC interaction and DSP consumption reporting data from a select subset of media IP assets and UGC interaction and DSP streaming engagement contexts are used as input in training the prediction model. Media IP assets in the consumption database 1060 that do not pass consumption volume thresholds for context-specific metrics are not utilized in the training of the model where the consumption and interaction volume thresholds are set on a regular cadence and are informed by the number of media IP assets distributed by the media asset distributor 1020.

In the feature engineering component 1077, thresholds for DSP consumption are established to facilitate training of the statistical models in the offline model training component 1078. This is accomplished in the data compilation subcomponent **1077*a* where the historical streaming engagement and social interaction trend reporting received from the consumption database 1060 are transformed into a tensor indexed by media IP assets $x_i$, streaming engagement and interaction contexts $f_1$ (e.g., active and passive stream counts on streaming DSPs, UGC video views and video likes on social media platforms, etc.), and time t (e.g., the date of the consumption/interaction). Here the consumption and interactions documented in the time series are aggregated at the media IP asset level and do not make use of individual media asset consumer or social media platform user behavior histories. The data compilation subcomponent 1077*a*** determines a set of media IP assets $\mathcal{M}$ of size M representing more than a threshold proportion $\tau_1$ of all distributed media IP assets. For those media IP assets that pass the threshold, let $S_1$ be the set of the DSP streaming engagement contexts and let $S_2$ be the set of UGC interaction contexts with a combined size of $N:=|S_1|+|S_2|$. Similarly let $\mathcal{T}$ be the T dates prior to and including the most recently available reporting data considered where the size of T is chosen such that the analysis will be practically executable on the computational resources available. Then the (i,j,k)-entry of the M×N×T tensor C represents the DSP stream or UGC interaction count for the i-th media IP asset $x_i$ and j-th engagement/interaction context $f_j$ on the k-th date $t_k$.

TABLE 1

Example of a tensor C of media IP asset streaming consumption and UGC interaction counts time series represented for several DSPs and social media platforms

| Stream/Interaction Events | | DSP Streaming Engagement and UGC Interaction Contexts | | | | | |
|---|---|---|---|---|---|---|---|
| | | Spotify | Apple Music | YouTube Active Art | YouTube Active | TikTok | |
| Media IP Asset | Time t (Date) | Active Streams | Active Streams | Track Views | UGC Views | Total Creations | . . . |
| Artist 1 - Song A | 2021 Sep. 1, | 436, | 274, | 185, | 346, | 12, | . . . |
| | 2021 Sep. 2, | 225, | 588, | 215, | 956, | 35, | . . . |
| | 2021 Sep. 3, | 930, | 977, | 343, | 1023, | 49, | . . . |
| | . . . | . . . | . . . | . . . | . . . | . . . | . . . |
| Artist 2 - Song B | 2021 Sep. 1, | 1093 | 1002, | 285, | 678, | 2, | . . . |
| | 2021 Sep. 2, | 1079 | 908, | 404, | 567, | 2, | . . . |
| | 2021 Sep. 3, | 448 | 834, | 118, | 583, | 3, | . . . |
| | . . . | . . . | . . . | . . . | . . . | . . . | . . . |
| Artist 2 - Song C | 2021 Sep. 1, | 1041, | 1007, | 262, | 287, | 45, | . . . |
| | 2021 Sep. 2, | 588, | 910, | 209, | 278, | 30, | . . . |
| | 2021 Sep. 3, | 844, | 774, | 243, | 298, | 39, | . . . |
| | . . . | . . . | . . . | . . . | . . . | . . . | . . . |
| . . . | . . . | . . . | . . . | . . . | . . . | . . . | . . . |

The daily counts of DSP streams and UGC interactions for each media IP asset $x_i$ and streaming engagement/interaction context $f_j$ are denoted by a vector v (i.e. the values of v range over $C_{x_i,f_j}$ in order over all values $t_k \in \mathcal{T}$), and are sent from the data compilation subcomponent **1077*a* to the offline significant change detection subcomponent 1077*b*. Here, they are modeled as noisy measurements of a latent multivariate state vector z consisting of level l, trend b, and periodic offset s components by employing a dynamic Bayesian network as described in the significant change detection component 1071** where explicitly modeling the posterior distribution of the trend b enables the detection of gradual significant changes by recursively calculating the probability that b significantly deviates from zero.

From this representation of the vector v, the level l and trend b at a time t can be extracted as well as the creation of a new cumulative indicator feature d which documents the time (in number of days) where the trend b significantly deviates from zero since its most recently detected significant deviation and indicates the significant growth status for each media IP asset $x_i$ and engagement/interaction context $f_j$. This enables the creation of a new tensor $\tilde{C}$, which augments C as follows $\tilde{C}_{x_i,f_j,t_k} := \langle v,l,b,d \rangle_{x_i,f_j,t_k}$.

TABLE 2

Example of a tensor $\tilde{C}$ of media IP assets and feature context time series where the feature context times series are extracted from the output of the significant change detection component 1071

| Stream/Interaction Events | | Feature Contexts Extracted from Significant Change Detection Output | | | | |
|---|---|---|---|---|---|---|
| | | Spotify Active Streams | | | | |
| Media IP Asset | Time t (Date) | Count v | Level l | Growth Rate b | Days of Significant Growth d | . . . |
| Artist 1 - Song A | 2021 Sep. 1, | 15163, | 15200, | 0.000692, | 1 | . . . |
| | 2021 Sep. 2, | 15213, | 15220, | 0.000971, | 2 | . . . |
| | 2021 Sep. 3, | 15234, | 15240, | 0.001009, | 3 | . . . |
| | . . . | . . . | . . . | . . . | . . . | . . . |
| Artist 2 - Song B | 2021 Sep. 1, | 9780, | 9775, | 0.000993, | 0 | . . . |
| | 2021 Sep. 2, | 9722, | 9750, | 0.000156, | 0 | . . . |
| | 2021 Sep. 3, | 9668, | 9760, | −0.000503, | 0 | . . . |
| | . . . | . . . | . . . | . . . | . . . | . . . |
| . . . | . . . | . . . | . . . | . . . | . . . | . . . |

TABLE 3

Example of a scalar feature matrix X used in the offline model training component 1078, where each scalar feature vector is associated with a media IP asset and a time t and the entries of the vectors are both features extracted from the output of the significant change detection component 1071 and further transformed and engineered features

| Stream/Interaction Events | | Extracted Feature Contexts | | Transformed and Engineered Features | | |
|---|---|---|---|---|---|---|
| Media IP Asset | Time t (Date) | YouTube Active UGC Views Days of Significant Growth | TikTok Total Views Days of Significant Growth | Spotify Active Streams Level Growth Feature | TikTok Total Creations to Views Ratio | . . . |
| Artist 1 - Song A | 2021 Sep. 1 | 1 | 0 | 0.00666 | 0.007578 | . . . |
| | 2021 Sep. 2 | 2 | 1 | 0.009347 | 0.007876 | . . . |
| | 2021 Oct. 13 | 0 | 1 | 0.009721 | 0.000553 | . . . |
| | . . . | . . . | . . . | . . . | . . . | . . . |
| Artist 2 - Song B | 2021 Sep. 23 | 0 | 1 | 0.009124 | 0.004907 | . . . |
| | 2021 Sep. 24 | 0 | 2 | 0.001431 | 0.004484 | . . . |
| | 2021 Sep. 25 | 0 | 3 | −0.004619 | 0.003984 | . . . |
| | . . . | . . . | . . . | . . . | . . . | . . . |
| . . . | . . . | . . . | . . . | . . . | . . . | . . . |

TABLE 4

Example of a scalar feature matrix used to generate the target vector in the offline model training component 1078

| Stream/Interaction Events | | Future Stream Extracted Feature Contexts | | | | |
|---|---|---|---|---|---|---|
| Media IP Asset | Time t (Date) | Next $N^{th}$ Day | Spotify Active Streams Growth Rate | Spotify Active Streams Days of Significant Growth | Apple Music Active Streams Growth Rate | Apple Music Active Streams Days of Significant Growth |
| Artist 1 - Song A | 2021 Jul. 30, | 2021 Jul. 31, | 0.003881 | 0 | 0.004471 | 0 |
| | | 2021 Aug. 1, | 0.003307 | 0 | 0.004741 | 0 |
| | | 2021 Aug. 2, | 0.003313 | 0 | 0.005002 | 0 |
| | | 2021 Aug. 3, | 0.007302 | 0 | 0.006719 | 0 |
| | | 2021 Aug. 4, | 0.039716 | 1 | 0.014159 | 0 |
| | | 2021 Aug. 5, | 0.038824 | 2 | 0.050271 | 1 |
| | | 2021 Aug. 6, | 0.037759 | 3 | 0.045116 | 2 |
| Artist 2 - Song B | 2021 Aug. 3, | 2021 Sep. 23, | 0.003942 | 0 | −0.000086 | 0 |
| | | 2021 Sep. 24, | 0.001543 | 0 | 0.001034 | 0 |
| | | 2021 Sep. 25, | −0.003353 | 0 | 0.001072 | 0 |
| | | 2021 Sep. 26, | −0.007129 | 0 | −0.001558 | 0 |
| | | 2021 Sep. 27, | −0.007466 | 0 | −0.001961 | 0 |
| | | 2021 Sep. 28, | −0.006083 | 0 | 0.025103 | 0 |
| | | 2021 Sep. 29, | −0.003173 | 0 | 0.015263 | 0 |
| . . . | . . . | . . . | . . . | . . . | . . . | . . . |

↓

| Stream/Interaction Events | | Target | |
|---|---|---|---|
| Media IP Asset | Time t (Date) | Numeric | Binary Classification |
| Artist 1 - Song A | 2021 Jul. 30, | 0.357143 | True |
| Artist 2 - Song B | 2021 Aug. 3, | 0.071429 | False |
| . . . | . . . | . . . | . . . |

TABLE 5

Example of a combined scalar feature matrix with target vector used in the offline model training component 1078.

| Stream/ Interaction Events | | Transformed and Engineered Features | | | |
|---|---|---|---|---|---|
| | | Spotify Active Streams Level | TikTok Total Creations to Views | | |
| Media IP Asset | Time t (Date) | Growth Feature | Ratio Feature | . . . | Target Numeric |
| Artist 1 - Song A | 2021 Jul. 30 | 0.00666 | 0.007578 | . . . | 0.357143 |
| | 2021 Jul. 31 | 0.009347 | 0.007876 | . . . | 0.004566 |
| | 2021 Oct. 13 | 0.009721 | 0.000553 | . . . | 0.005234 |
| | . . . | . . . | . . . | . . . | . . . |
| Artist 2 - Song B | 2021 Aug. 03 | 0.009124 | 0.004907 | . . . | 0.009124 |
| | 2021 Sep. 24 | 0.001431 | 0.004484 | . . . | 0.029098 |
| | 2021 Sep. 25 | −0.004619 | 0.003984 | . . . | 0.002594 |
| | . . . | . . . | . . . | . . . | . . . |
| . . . | . . . | . . . | . . . | . . . | . . . |

In the embodiment described herein, training of the statistical models in the offline model training component 1078 requires a real-valued scalar feature matrix X as input and a target vector y as output. In the feature engineering component 1077, the tensor $\tilde{C}$ is transformed into a matrix by expanding both the rows and columns for specific times t. In a specific embodiment the interaction contexts $f_j \in S^*$, where $S^* \subseteq S_2$ is a subset of UGC interaction contexts, are used for determining the set of media IP assets and their associated times for which to generate the rows of the matrix X. For a given media IP asset $x_i$, let $k_i \geq 0$ be the largest nonnegative integer such that for $0 \leq r \leq k_i$ there exists an $f_j \in S^*$ such that d>0 in the tensor $\tilde{C}_{x_i,f_j,t_r}$ for the time $t_r$. This gives a new matrix X where the number of rows is $\Sigma_{1 \leq i \leq M} \Sigma_{0 \leq r \leq k_i} 1$ and the number of columns is m where the columns are constructed by a set of functions $g_i(\tilde{C}_{x_i,f_j,t_r}), \ldots, g_m(\tilde{C}_{x_i,f_j,t_r})$ that map a combination of the level, trend and significant growth status extracted feature contexts to a set of transformed and engineered features.

In a specific embodiment, each row of the scalar feature matrix X and target vector y correspond to a specific media IP asset $x_i$ and time $t_r$. Since the goal of the offline model training component 1078 is to build a model that predicts future streaming consumption patterns from current and recent streaming DSP consumption and UGC interaction patterns, the target vector y is constructed using only future streaming consumption patterns. That is, for a media IP asset $x_i$ at a given time $t_r$, the corresponding value of the target is constructed from a function h which takes as input the extracted features in the tensor $\tilde{C}_{x_i,f_j,t_r}$ that are associated with data from the streaming DSP consumption state vectors and the rows that are associated with the future times $$t_r + 1, \ldots, +t_r + \Delta \text{ for } f_j \in S_1$$

where Δ is a global parameter that does not depend on the choice of $x_i$ or $f_j$ as arguments, and it maps to a finite number of discrete values for tree-based regression model training. The finite set of target values gives a finite set of possible values for the decision boundary for the binary classification model based on the regression model output. The scalar feature matrix X and target vector y are then sent to the offline model training component 1078.

In a specific embodiment the offline model training component 1078 employs a classification model based on a tree-based regression model adapted to the use case of opportunity detection within a marketing analytics pipeline 1000 as follows. Within any binary classification model there is a trade-off between precision (the proportion of correct positive predictions out of all positive predictions) and recall (the proportions of positive predictions out of all positive cases), where the goal of the model prediction informs the prioritization of one over the other. This trade-off is parameterized using the standard $F_\beta$ score for model evaluation where the choice of the parameter β is predetermined and is informed by minimizing false positive predictions while still allowing for a significant number of true positive predictions.

The model is further parameterized by two threshold parameters, where the first threshold parameter defines the decision boundary for the labeling of a data point as being a positive or a negative case, and the second threshold parameter defines the decision boundary that classifies the numeric values of the regressor output into positive or negative predictions. The values of the two threshold parameters are determined as part of the hyperparameter learning process.

In a specific embodiment of the offline model training process, a simulation for a set of threshold combinations is run for n times with a tree-based regressor having a fixed set of default hyperparameters. The threshold parameters are then set to the combination selected in the majority voting of the best $F_\beta$ score, where the predetermined parameter β in the $F_\beta$ score prioritizes precision over recall. The initial set of threshold combinations run in the simulation are confined to a subset of all possible combinations; ideally, the values of the defining threshold parameters should be such that they label the cases where significant growth detected in UGC interactions are followed by the detection of significant growth in active streaming consumption on DSPs as positive and labels the cases where significant growth detected in UGC interactions that are not followed by the detection of significant growth in active streaming consumption on DSPs as negative. The set of default tree-based regressor hyperparameters and the threshold combination that received the majority of votes together define the set of default hyperparameters of this binary classifier.

The next step in the offline model training process employs feature selection to ensure that the final model is only trained with engineered features that are relevant for predicting significant active growth on streaming DSPs. In a specific embodiment, a correlation analysis is used as a first scan to select a set of core features that exhibit strong linear association with the engineered target values, and the default binary classifier trained with the core features gives the baseline model. Each of the remaining features are only selected if the default binary classifier trained including these features in addition to the core features outperforms the baseline model and they define the set of features used in the final offline model training step.

The last step in the offline model training process is the final model hyperparameter tuning. A procedure adopted from a standard grid search cross-validation method is used to tune the hyperparameters in the tree-based regression model. The offline model training component 1078 then sends the final classification model to the online model prediction component 1074 in the online opportunity detection component 1075.

Online Opportunity Detection Component 1075

The online opportunity detection component 1075 of the opportunity detection analytics hub 1070 is a generalization of the significant change detection component 1071 described above to the setting of time series of UGC interactions on social media platforms. For a given media IP asset $x_i \in \mathcal{M}$ and engagement/interaction context $f_i \in S_1 \cup S_2$ the vector v is modeled as in the offline opportunity detection subcomponent where for each time t, the level l, trend b and significant growth status d can be extracted from the state information. When there exists a time $t_0$ such that the significant growth status $d_{t_0}$ is positive for at least one UGC interaction context $f_j \in S^*$, all engagement and interaction contexts in $S_1 \cup S_2$ are then transformed according to the feature engineering component 1077 and sent to the online model prediction component 1074 along with the significant growth status of the remaining engagement/interaction contexts as a vector q where the entries of q are both features extracted from the output of the significant change detection component 1071 and further transformed and engineered features evaluated at the time $t_0$.

Let $S_1' \subseteq S_1$ denote the subset of active streaming engagement contexts on DSPs. Then in the case where the media IP asset $x_i$ is already experiencing significant growth for at least one $f_j \in S_1'$ at time $t_0$ then it is not necessary to apply the classification model to the vector q to make a prediction of whether there will be subsequent significant growth detected associated with active streaming consumption. The vector q is sent directly to the significant change attribution component 1072 for further evaluation of the potential marketing opportunity of the media IP asset.

In the case where the media IP asset $x_i$ is not experiencing significant growth for any $f_j \in S_1'$ at time $t_0$ then the classification model trained in the offline model generation component is applied to the vector q to receive a binary outcome prediction. The classification model predicts whether or not there will be subsequent significant growth detected associated with active streaming consumption on streaming DSPs given the detected significant growth in UGC interactions. In the case of a positive outcome, the online model prediction component 1074 sends the vector q along with the model outcome prediction to the significant change attribution component 1072 for further evaluation of the potential marketing opportunity of the media IP asset. In the case of a negative outcome, the significant growth in UGC interactions is classified as a non-opportunity so no further evaluation is required at this point. However, if at time $t_1 > t_0$ the significant growth status $d_{t_1}$ is positive for at least one UGC interaction context $f_j \in S^*$ the online model prediction component 1074 continues to make predictions as long as the media IP asset $x_i$ is not experiencing significant growth for any $f_j \in S_1'$.

Each prediction outcome on each day is associated with one of the following four scenarios: (1) The media IP asset managers/owners 1010 are alerted to worthwhile marketing opportunities in the marketing action analytics hub 1080 at an earlier time. This occurs when there is significant growth detected in at least one UGC interaction context and a positive prediction is made of subsequent significant growth in active streaming consumption on streaming DSPs for a media IP asset $x_i$ at a time $t_0$ and this opportunity is sent from the online opportunity detection component 1075 to the marketing action analytics hub 1080. Then for the same media IP asset $x_i$ at a short time $t_1 > t_0$ significant growth in active streaming consumption is later detected. (2) The media IP asset managers/owners 1010 receive an alert of a worthwhile opportunity from the online opportunity detection component 1075, but the alert is not received in advance of the detection in active streaming consumption. This occurs when significant growth is detected in UGC interactions for a media IP asset $x_i$ at a time $t_0$ and a negative prediction is made so no alert is sent to the marketing action analytics hub 1080, but subsequently at a time $t_1 > t_0$ the online opportunity detection component 1075 detects significant growth in active streaming consumption for the same media IP asset $x_i$. (3) The media IP asset managers/owners 1010 are alerted to opportunities as a result of their significant growth in UGC interactions that are incorrectly classified as worthwhile. This occurs when significant growth is detected in UGC interactions and a positive prediction is made of subsequent significant growth in active streaming consumption on streaming DSPs for a media IP asset $x_i$ at a time $t_0$ and this opportunity is potentially (depending on the classification made by the growth potential evaluation component 1073) sent from the online opportunity detection component 1075 to the marketing action analytics hub 1080, but no subsequent significant growth in active streaming consumption on DSPs is detected at a later time $t_1 > t_0$ for the same media IP asset $x_i$ in the online opportunity detection component 1075 resulting in a false alert being sent to the marketing action analytics hub 1080. (4) The media IP asset managers/owners 1010 do not receive an alert of a non-opportunity from the marketing action analytics hub 1080. This occurs when significant growth is detected in UGC interactions for a media IP asset $x_i$ at a time $t_0$ and a negative prediction is made and no subsequent growth in active streaming consumption on DSPs is detected at a later time $t_1 > t_0$ for the same media IP asset $x_i$ in the online opportunity detection component 1075.

Figure 8A:
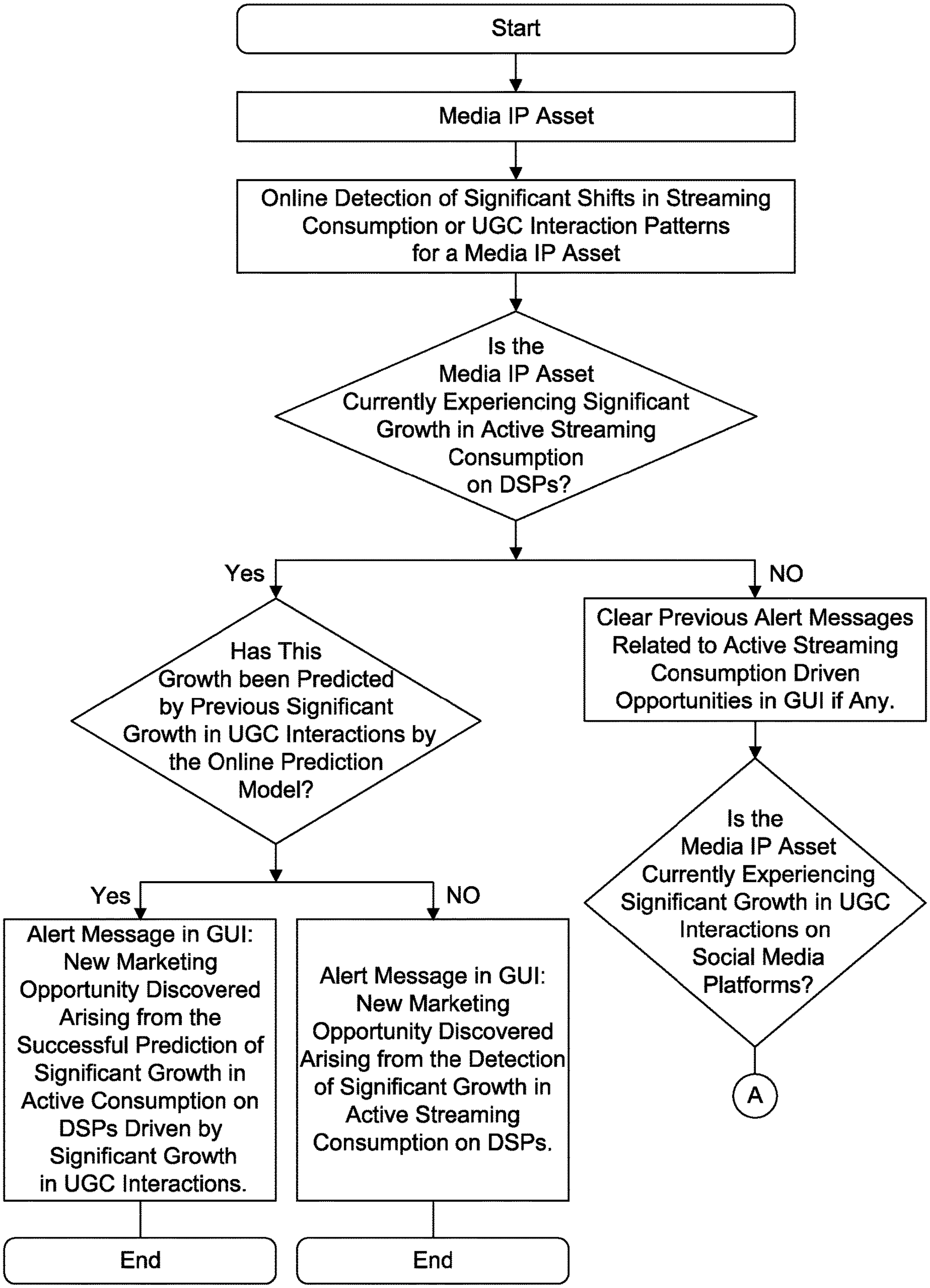
FIGS. 8A and 8B together depict a flow diagram explaining the alerts and notifications provided to the managers/owners of media IP assets based on daily prediction outcome and on whether significant growth was or was not detected.
Figure 8B:
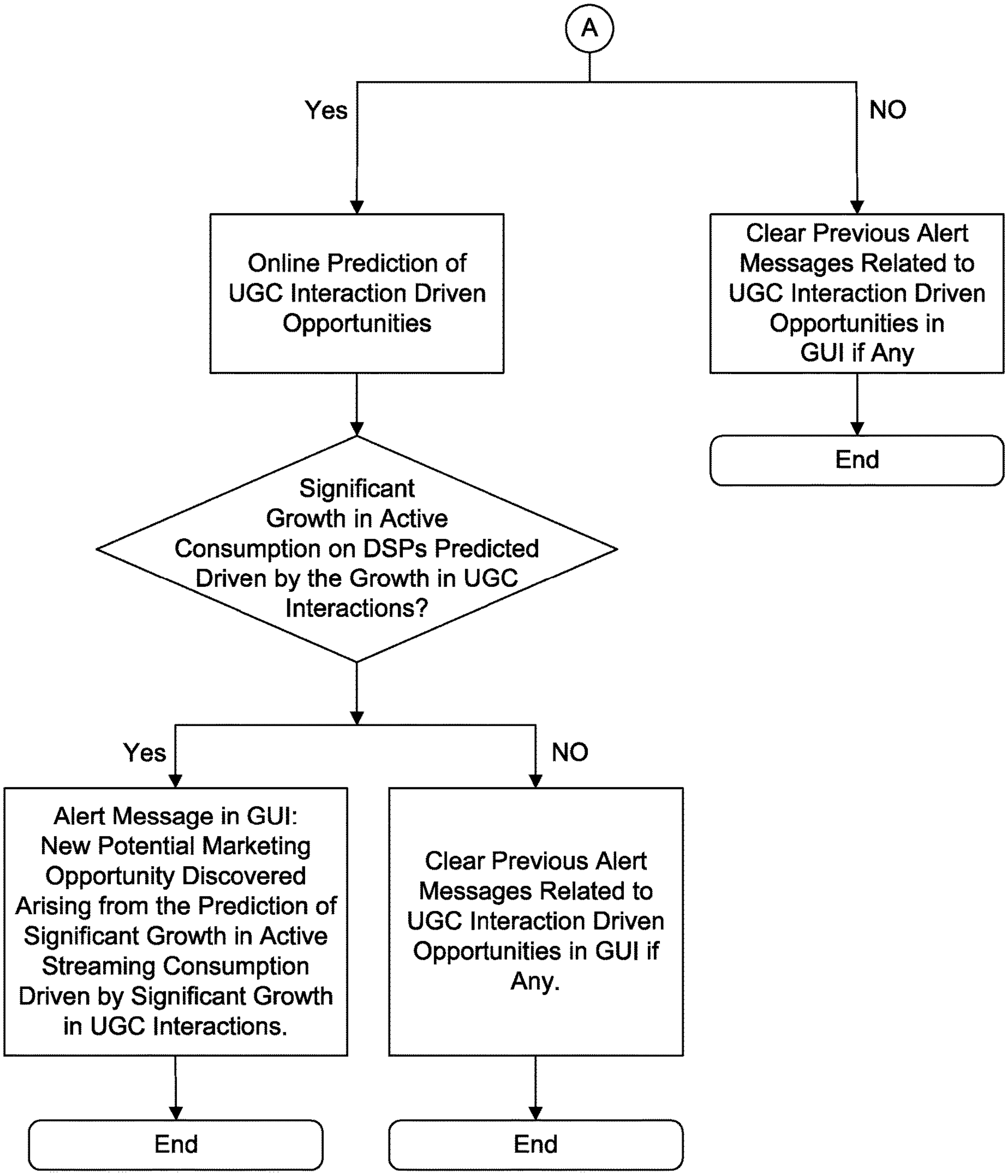

FIG. 8 is a flow diagram for explaining the alerts and notifications provided to the managers/owners of media IP assets 1010 in each of the four scenarios (1) through (4), above, based on daily prediction outcome and whether significant growth was or was not detected.

Of the four scenarios outlined above the third scenario where the opportunity detection analytics hub 1080 potentially sends a false alert to the marketing action analytics hub 1080 is the scenario that the model trained in the offline prediction model generation component 1076 is prioritized to avoid. This is accomplished through evaluating model performance that prioritizes precision over recall. Higher precision is prioritized over recall because a negative model prediction that is then followed by a worthwhile opportunity in streaming consumption detected by the opportunity detection analytics hub 1070 is only overlooked in advance rather than missed completely.

Marketing Action Analytics Hub 1080

Briefly, according to one aspect described herein, the marketing action analytics hub 1080 is configured to receive marketing campaign goals for specific media IP assets from an opportunity detection analytics hub 1070 within a marketing analytics pipeline 1000 or directly from media IP asset managers/owners 1010 through the marketing platform 1040.

The marketing action analytics hub 1080 includes an offline model generation component 1820 and an online audience generation component 1850, and these are discussed in turn below. Note that the Offline Model Generation Component 1820 of the marketing action analytics hub 1080 is not to be confused with the Offline Prediction Model Generation component 1076 of the opportunity detection analytics hub 1070.

Offline Model Generation Component 1820

Figure 4A:
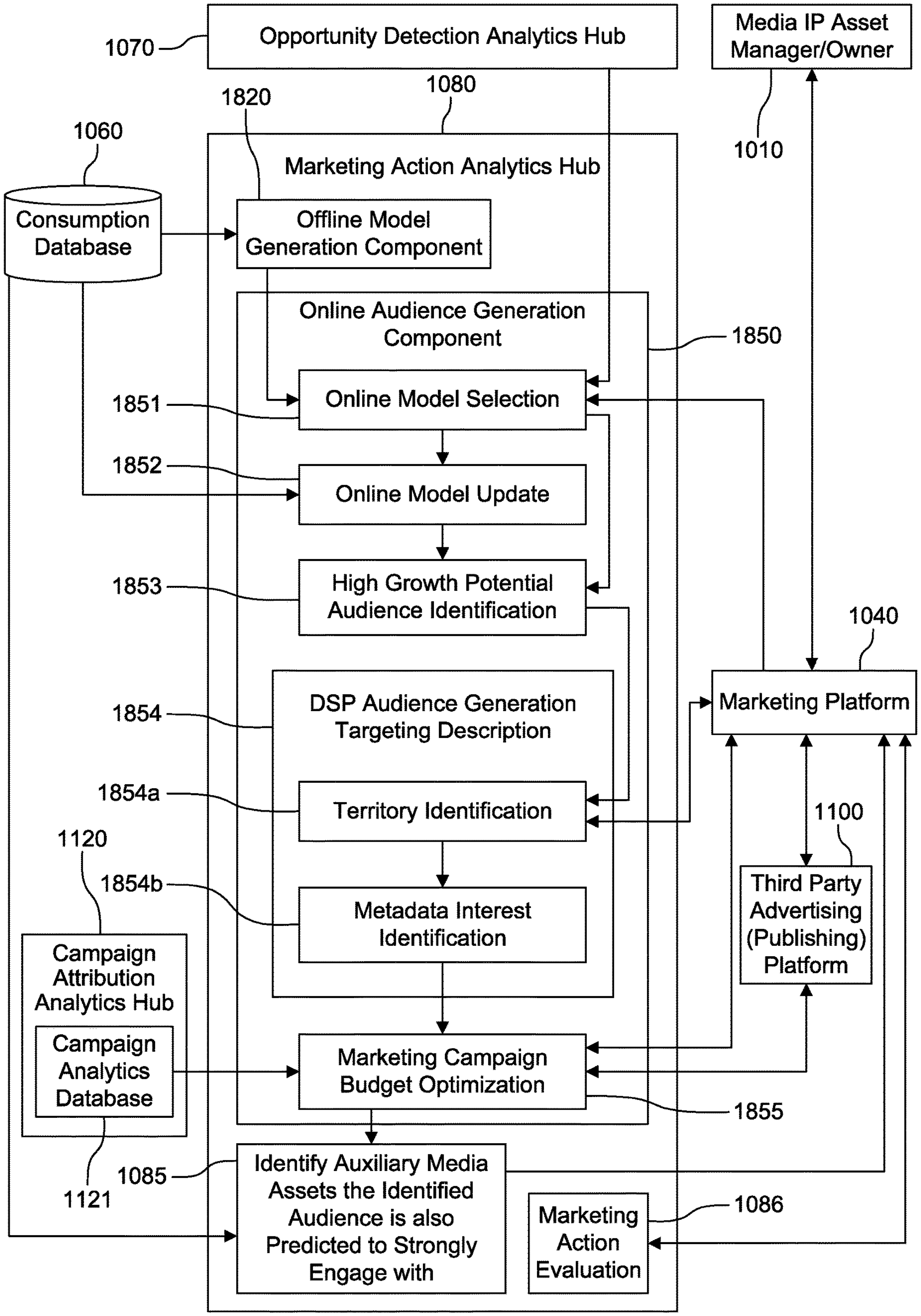
FIG. 4A is a schematic showing an online audience generation component of a marketing action analytics hub according to some embodiments of the disclosure.
Figure 4B:
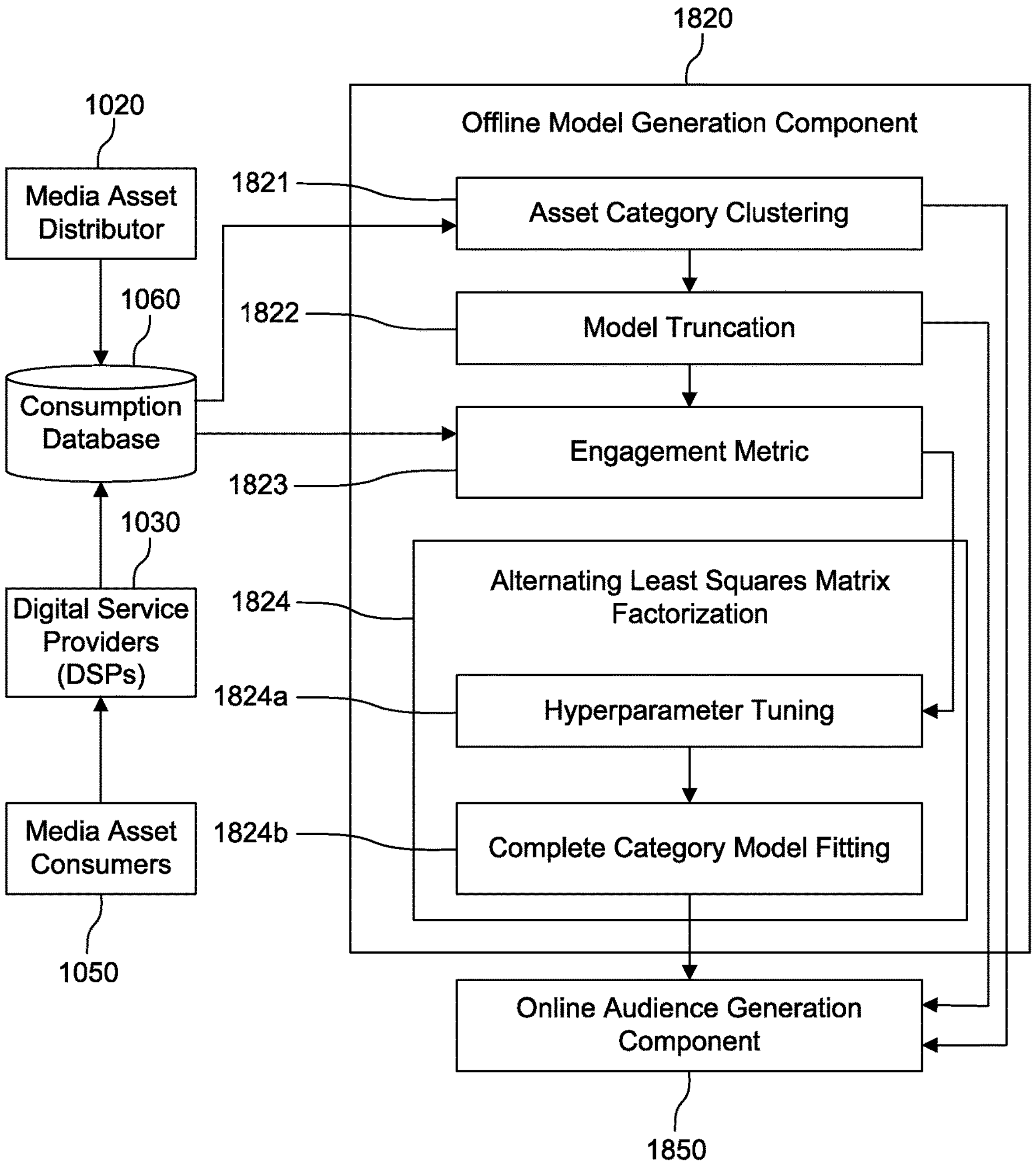
FIG. 4B is a schematic showing an offline model generation component of a marketing action analytics hub according to some embodiments of the disclosure.

FIG. 4B depicts one example of an offline model generation component 1820 and its interaction with other components of the marketing analytics pipeline 1000. Briefly, according to one aspect described herein, to generate an offline model, the offline model generation component 1820 receives transaction-level trend data reports on media IP assets from a consumption database 1060 on a regular cadence, and clusters media IP assets into a finite set of categories. The categories are sent to the online audience generation component 1850 of the marketing action analytics hub 1080, which is described later in connection with FIGS. 4A and 7B. Statistical models are trained, specifically statistical models of geodemographic media IP asset engagement, on a regular cadence for each category. Training of the statistical models includes: the establishment of thresholds for DSP consumption reporting data; the construction of a consumption tensor reflecting per-channel consumption of each media IP asset from each geodemographic group; the transformation of the consumption tensor to an engagement matrix using engagement metrics; the training and fit of each category-specific model using a matrix factorization algorithm on the engagement matrix as approximated using hyperparameters so as to minimize a cost function; and the refinement and tuning of the hyperparameters followed by a repeat of the train-and-fit step as necessary.

Figure 7A:
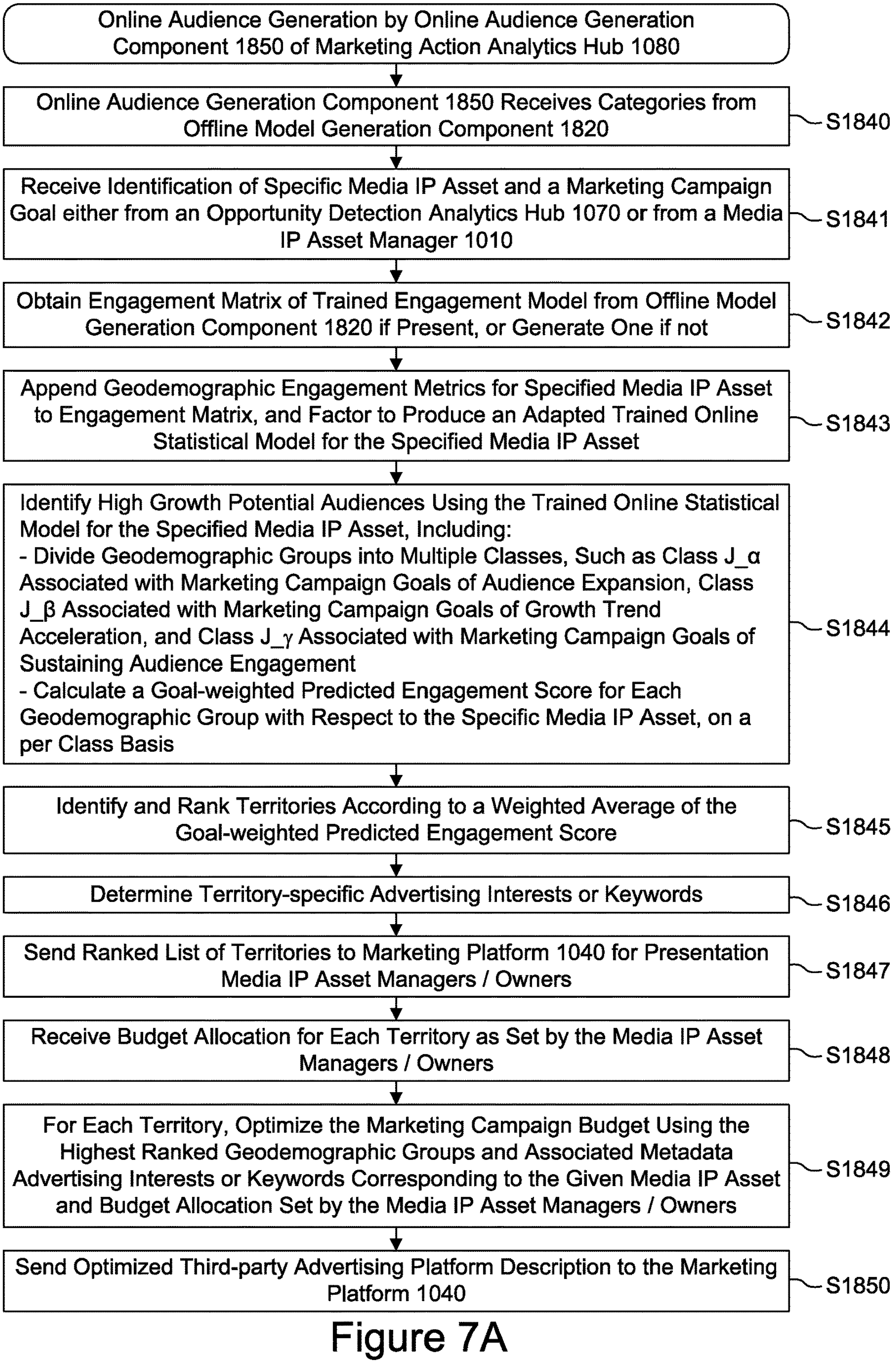
FIG. 7A is a flow diagram depicting a plurality of steps executed by the online audience generation component according to some embodiments of the disclosure.
Figure 7B:
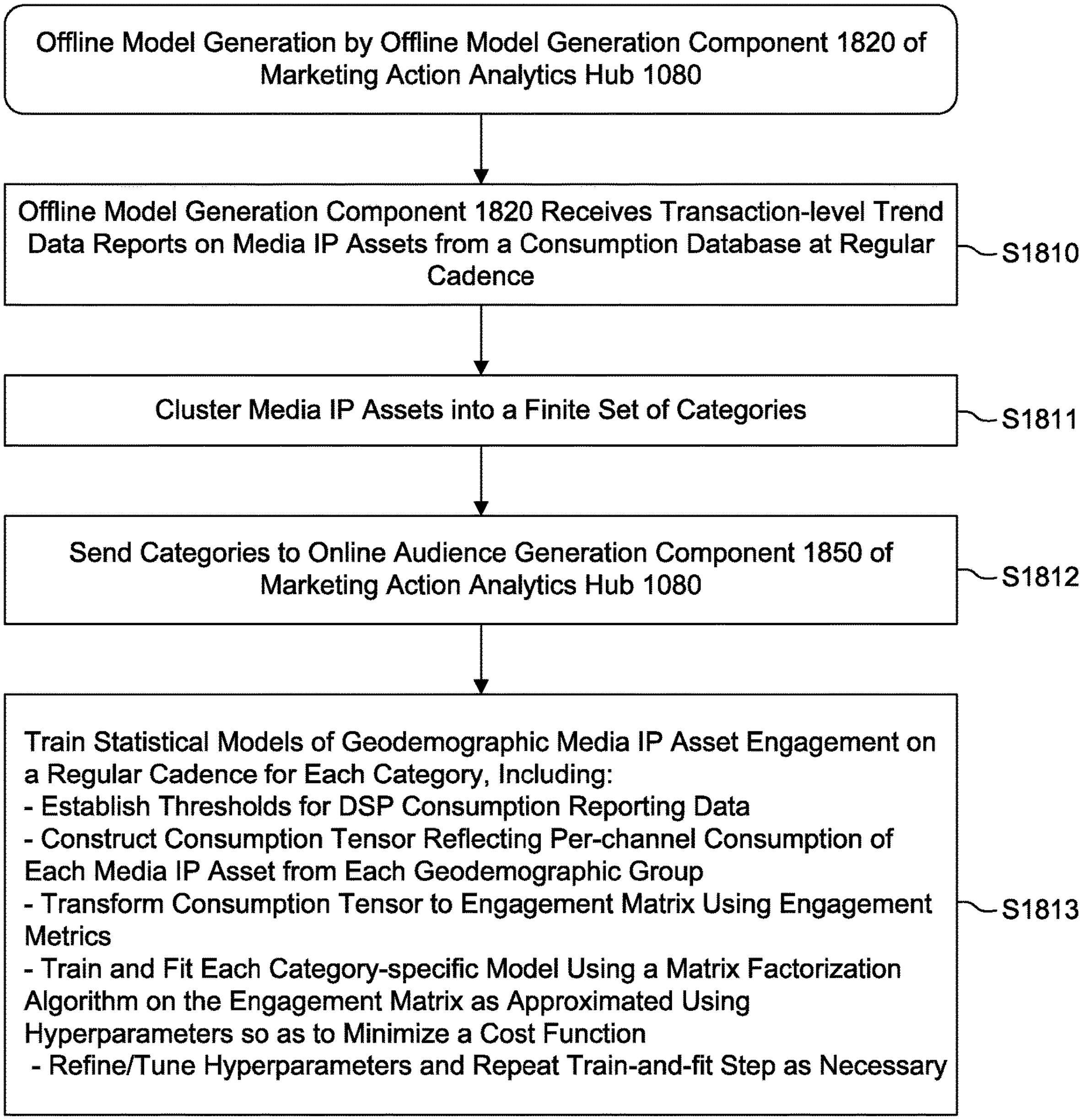
FIG. 7B is a flow diagram depicting a plurality of steps executed by the offline model generation component according to some embodiments of the disclosure.

In more detail FIG. 7B is a flow diagram depicting offline model generation by the offline model generation component 1820, which is depicted in FIG. 4B.

Associated with each media IP asset are metadata supplied to the media asset distributor 1020 by the media IP asset managers/owners 1010. As shown at step S1810, on a regular cadence (e.g., weekly, monthly) all media IP assets $\mathcal{M}$ in the consumption database 1060 are sent to the offline model generation component 1820 where they are clustered (at step S1811) into a finite set of (possibly overlapping) categories C in the asset category clustering component 1821, using a combination of statistical clustering methods based on aggregate geodemographic engagement, genre metadata, and other available data e.g. DSP public playlists and terrestrial radio co-occurrence. Additionally, since new media IP assets are continually sent to the media asset distributor 1020, new media IP assets must be assigned categories using only metadata available before associated trend reporting is received from the DSPs. These media IP asset category assignments are sent to the online audience generation component 1850 (at step S1812).

At step S1813, statistical models of geodemographic media IP asset engagement are trained offline on a regular cadence (e.g., daily, weekly) for each category described above in the offline model generation component 1820. To accommodate size and speed constraints on the generation of target audiences in the online audience generation component 1850, only the DSP consumption reporting data from a select subset of media IP assets and geodemographic groups are used as input in training the category specific models of geodemographic media IP asset engagement. Media IP assets in the consumption database 1060 that do not pass consumption volume thresholds for geodemographic groups are not utilized in the training of the model where the consumption volume thresholds are set on a regular cadence and are informed by the number of media IP assets in a given category.

As seen in step S1813, training of the statistical models includes the establishment of thresholds for DSP consumption reporting data. Specifically, for each given category of media IP assets $c \in \mathcal{C}$ of size M, let $\mathcal{G}$ be the set of (possibly consolidated) geodemographic groups of size N reported by the DSPs to have had any consumption of any of the media IP assets in c, and let $C_{ij}$ denote the (i,j)-entry of the M×N matrix C corresponding to the number of streaming events of the i-th media IP asset by the j-th geodemographic group. This consumption matrix C, generated by the asset category clustering component 1821 is then passed along to and further processed in the model truncation component 1822 as follows. Sort rows of C according to its row sums in decreasing order and similarly sort columns of C according to its column sums in decreasing order. Let I be the top m rows and J be the top n columns of the permuted matrix with m and n chosen so that: (1) the sum of all entries of the m×N submatrix of C indexed by I is more than a threshold proportion $\tau_i$ of $|C|_1 := \Sigma_{i,j} C_{ij}$, the sum of all entries of the complete M×N matrix C, (2) the sum of all entries of the M×n submatrix of C indexed by J is more than a threshold proportion $\tau_2$ of $|C|_1$, (3) the m×n submatrix of C indexed by I and J is more than a threshold proportion $\tau_3$ of $|C|_1$, (4) the sparsity, i.e. the proportion of zero entries of the submatrix, is less than $\tau_4$, and (5) the product m·n is less than $\tau_5$, where $\tau_5$ is chosen to ensure that the analysis will work within the computational resource constraints of the particular implementation. The media IP assets associated with I and the geodemographic groups associated with J are then passed on to the engagement metric component 1823 where they will be used in further category specific analyses. The consumption threshold criteria (1, 2, 3) above ensure that a sufficient volume of the total consumption of the media IP asset category is included in the subsequent model, while the sparsity requirement (4) ensures that geodemographic groups and media IP assets with low consumption volumes, which might otherwise introduce noise into subsequent measures of engagement, are excluded from the analysis and the size requirement above (5) ensures that the analysis will be practically executable on the computational resources available. In the case where it is not possible to satisfy all the constraints, the smallest possible subset that satisfies all (1, 2, 3) or the largest possible subset that satisfies at least one of (4) or (5) is chosen.

Additionally, in the model truncation component 1822 for each given category, a geodemographic weight $\omega_j$ is computed for each geodemographic group $j \in J$ as a function of the consumption of all media IP assets $i \in I$ by that geodemographic group, and also geodemographic specific measures of population size, e.g., from publicly available census data, and DSP subscription rates, e.g., from shareholder reports. As an example, in a particular embodiment these weights are computed as $\omega_j := \Sigma_{i \in I} C_{ij}$. These geodemographic weights are then passed to the online audience generation component 1850 and the engagement metric component 1823.

As further seen in step S1813, training of the statistical models includes the construction of a consumption tensor reflecting per-channel consumption of each media IP asset from each geodemographic group. Specifically, for each given category $c \in \mathcal{C}$, let $V_{ij}$ denote the (i,j)-th vector of the m×n×t tensor V with each element of $V_{ij}$ corresponding to the number of streaming events within each of t distinct consumption channels indexed by h, of the i-th media IP asset from the set I by the j-th geodemographic group from the set J. Here consumption channels are all reported combinations of device types (e.g., mobile, PC, gaming console, etc.), operating systems (Android, iOS, Linux, etc.), streaming engagement contexts within the DSP clients (e.g., chart, collection, radio station, etc.), and time windows within the analysis period (e.g., weekly or daily aggregates). For example, one of several thousand of channels receives consumption volume from mobile phones with iOS operating systems from user collections last week while another channel receives consumption from a DSP web-client on a PC from DSP charts two weeks ago. Then let $V_{ijh}$ be the consumption in channel h of the i-th media IP asset from the j-th geodemographic group. The engagement metric component 1823 uses the indices I and J from the model truncation component 1822 to obtain the relevant data from the consumption database 1060 which is then used to construct the tensor V.

As further seen in step S1813, training of the statistical models includes the transformation of the consumption tensor to an engagement matrix using engagement metrics. While latent factor analyses are directly possible for tensors such as V, the specific embodiment disclosed herein uses a computationally streamlined approach of first mapping these consumption vectors to a scalar metric of engagement, i.e.

$$f(V_{ij}, \omega_j) = E_{ij},$$

which defines an engagement matrix E. As an example of an engagement metric in a particular embodiment, let $\mathcal{A}$ be a set of channels corresponding to consumption primarily initiated by intentional choices of DSP media asset consumers as contrasted with consumption primarily driven by DSP editorial teams, recommendation algorithms and third-party curators and tastemakers. Then let $$E_{ij} := \frac{(A_{ij})^2}{A_{ij} + P_{ij}}$$

be the scalar engagement metric in this example where $A_{ij} := \Sigma_h 1_{\mathcal{A}}(h) \cdot V_{ijh}$ and $P_{ij} := \Sigma_h (1 - 1_{\mathcal{A}}(h)) \cdot V_{ijh}$ are the active and passive consumption respectively for the i-th media IP asset from the j-th geodemographic group. The process and method described herein permits the use of many such scalar engagement metrics and one familiar with the art will be able to generalize from this example. After the consumption tensor V has been transformed into an engagement matrix E, this engagement matrix is passed on to the ALS matrix factorization component 1824.

TABLE 6

Example of a tensor V of geodemographic group-media IP asset consumption volume by channel

| [Stream Events] | | Context/Channel | | | |
|---|---|---|---|---|---|
| Media IP Asset | Geodemographic Group | Mobile-Android-radio-previous week | Mobile-iOS-collection-2 weeks previous | PC-Windows-chart-previous week | . . . |
| Artist 1-Song A | Males aged 18-24 in New York NY, US using premium Spotify | 436 | 274 | 185 | . . . |
| | Females aged 25-34 in Ireland using ad-supported YouTube | 225 | 588 | 215 | . . . |
| | Females aged 25-34, Para, BR using ad-supported Deezer | 930 | 977 | 343 | . . . |
| | . . . | . . . | . . . | . . . | . . . |
| Artist 2-Song B | Males aged 18-24 in New York NY, US using premium Spotify | 1093 | 1002 | 285 | . . . |
| | Females aged 25-34 in Ireland using ad-supported YouTube | 1079 | 908 | 404 | . . . |
| | Females aged 25-34, Para, BR using ad-supported Deezer | 448 | | 118 | . . . |
| | . . . | . . . | . . . | . . . | . . . |
| Artist 2-Song C | Males aged 18-24 in New York NY, US using premium Spotify | 1041 | 1007 | 262 | . . . |
| | Females aged 25-34 in Ireland using ad-supported YouTube | 588 | 910 | 209 | . . . |
| | Females aged 25-34, Para, BR using ad-supported Deezer | 844 | 774 | 243 | . . . |
| | . . . | . . . | . . . | . . . | . . . |
| . . . | . . . | . . . | . . . | . . . | . . . |

TABLE 7

Example of a matrix E of geodemographic group-media IP asset engagements

| [Engagement Metric] | Males aged 18-24 in New York NY, US using premium Spotify | Females aged 25-34 in Ireland using ad-supported YouTube | Females aged 25-34, in Para, Brazil using ad-supported Deezer | . . . |
|---|---|---|---|---|
| Song A by Artist 1 | −4 | −5 | 3 | . . . |
| Song B by Artist 2 | 3 | −8 | 2 | . . . |
| Song C by Artist 2 | −1 | 9 | 8 | . . . |
| Song D by Artist 3 | −3 | 1 | −7 | . . . |
| Song E by Artist 4 | 4 | 2 | 1 | . . . |
| . . . | . . . | . . . | . . . | . . . |

As further seen in step S1813, training of the statistical models includes the training and fit of each category-specific model using a matrix factorization algorithm on the engagement matrix E as approximated using hyperparameters so as to minimize a cost function. Specifically, in the ALS matrix factorization component 1824 the statistical models for each category described above are trained and fit using a matrix factorization algorithm. The matrix factorization model approximates a matrix by a product of two latent factor matrices $E \approx E_{est} = XY^T$ where X is an m×k matrix, Y is an n×k matrix, and $k \leq \min(m, n)$. The m·n entries of E are split into a training set $S_{train}$ and a test set $S_{test}$ of indices, and an alternating least squares (ALS) framework is used to factorize the matrix E by minimizing the cost function $$\mathrm{cost}(X, Y) := \sum_{(i,j)\in S_{train}} (E_{ij} - X_i Y_j^{\,T})^2 + \lambda\left(\sum_{i\in I} \|X_i\|^2 + \sum_{j\in J} \|Y_j\|^2\right)$$

where $X_i$ and $Y_j$ respectively denote the i-th and j-th rows of the matrices X and Y, λ is a regularization parameter, and $\|\cdot\|$ denotes the $l_2$ norm. The analytic expressions that minimize the cost function for $X_i$ and $Y_i$ for a fixed Y and a fixed X respectively are $$X_i = (ED^{(i)} Y((Y^T D^{(i)} Y + \lambda \cdot Id)^{-1})^T)_i$$

and $$Y_j = (E^T D^{(j)} X((X^T D^{(j)} X + \lambda \cdot Id)^{-1})^T)_j$$

where $D^{(i)}$ is an n×n diagonal matrix with the j-th diagonal element one if $(i,j) \in S_{train}$ and zero otherwise, and similarly for the m×m matrix $D^{(j)}$ and Id is the appropriately sized identity matrix. As is typical of an ALS framework the above equations for $X_i$ and $Y_j$ are applied iteratively to update an approximation which converges to a unique solution of the cost function cost(X, Y).

A computational bottleneck to minimizing the cost function is computing the $Y^T D^{(i)} Y$ and $X^T D^{(i)} X$ terms and their respective inverse matrices for every row in each alternating iteration, which has time complexity $O(mnk^2)$. To alleviate this bottleneck, the following approximation is utilized instead when iteratively updating X and Y, $$X_i = (ED^{(i)} Y((Y^T Y + \lambda \cdot Id)^{-1})^T)_i$$

and $$Y_j = (E^T D^{(j)} X((X^T X + \lambda \cdot Id)^{-1})^T)_j,$$

as this reduces the time complexity to O(mnk). The speedup afforded by this approximation is critical to the computational efficiency of this process, as the quality of the recommendation provided by the model is dependent on the hyperparameter selection of the factorization model, i.e. k and λ representing the number of latent factors of the model and the strength of regularization respectively. An additional advantage of this approach is that it is readily adapted to manage missing data robustly.

As further seen in step S1813, training of the statistical models includes the refinement and tuning of the hyperparameters followed by a repeat of the train-and-fit step as necessary. More specifically, in the hyperparameter tuning subcomponent 1824*a* of the ALS matrix factorization component 1824 the hyperparameters are chosen using a standard cross-validation scheme, again for each of the specific categories of media IP assets being analyzed independently. Specifically, the values of k and λ are determined by minimizing the sum of squared errors $$SSE(k, \lambda) := \sum\nolimits_{(i,j)\in S_{test}} \left(E_{i,j}^{(k,\lambda)} - E_{i,j}\right)^2$$

using an adaptive grid search where $E_{i,j}^{(k,\lambda)}$ is the (i,j)-entry in the matrix $E_{est}^{(k,\lambda)}$ denoting the estimate obtained from the adapted ALS procedure described above for a given hyperparameter pair (k, λ). Once this hyperparameter pair is selected the model is then trained again to minimize the cost function on the combined train and test dataset using the chosen k and λ to fit $E_{est} = XY^T$, in the complete category model fitting subcomponent 1824*b*, the complete fitted model is then sent to the online audience generation component 1850.

Online Audience Generation Component 1850

FIG. 4A depicts one example of the online audience generation component 1850 and its interaction with other components of the marketing analytics pipeline 1000. Briefly, according to one aspect described herein, for online

TABLES 8 & 9

Example of factors of the engagement matrix

| [Media IP Asset Tastes] | Latent Factor 1 | Latent Factor 2 | . . . | | [Geodemographic Tastes] | M 18-24, New York NY, US Prem-Spotify | F 25-34, IE, Ad-YT | FM 18-34, Para, BR Ad-Deezer | . . . |
|---|---|---|---|---|---|---|---|---|---|
| Song A by Artist 1 | 1 | −1 | . . . | × | Latent Factor 1 | 0 | −3 | −2 | . . . |
| Song B by Artist 2 | 2 | −2 | . . . | | Latent Factor 2 | −1 | 1 | −3 | |
| Song C by Artist 2 | −3 | −1 | . . . | | . . . | . . . | . . . | . . . | |
| Song D by Artist 3 | 1 | 2 | . . . | | | | | | |
| Song E by Artist 4 | −1 | 0 | . . . | | | | | | |
| . . . | . . . | . . . | . . . | | | | | | |

TABLE 10

Latent factor approximation of the engagement matrix

| (Estimated Engagements) | M 18-24, New York NY, US | F 25-34, IE | FM 18-34, Para, BR | . . . |
|---|---|---|---|---|
| Song A by Artist 1 | 1 | −4 | 2 | . . . |
| Song B by Artist 2 | 1 | −8 | 2 | . . . |
| Song C by Artist 2 | 0 | 9 | 8 | . . . |
| Song D by Artist 3 | −2 | 1 | −7 | . . . |
| Song E by Artist 4 | 0 | 2 | 2 | . . . |
| . . . | . . . | . . . | . . . | . . . |

generation of an audience, the online audience generation component 1850 receives categories from the offline model generation component 1820, and receives identification of specific media IP asset(s) and marketing campaign goal(s) either from the opportunity detection analytics hub 1070 or from a media IP asset manager 1010. An engagement matrix of a trained engagement model is obtained from the offline model generation component 1820 if present, or one is generated if not. Geodemographic engagement metrics for specified media IP asset(s) are appended to the engagement matrix, which is factored to produce an adapted trained online statistical model for the specified media IP asset(s). High growth potential audiences are identified using the trained online statistical model for the specified media IP asset(s). Identification of high growth potential audiences includes: dividing geodemographic groups into multiple classes, such as class $J_\alpha$ associated with marketing campaign goals of growth through audience expansion, class $J_\beta$ associated with marketing campaign goals of growth trend acceleration, and class $J_\gamma$ associated with marketing campaign goals of sustaining audience engagement i.e. re-engagement; and calculating a goal-weighted predicted engagement score for each geodemographic group with respect to the specific media IP asset, on a per class basis. Territories are identified and ranked according to a weighted average of the goal-weighted predicted engagement score, and territory-specific advertising interests or keywords are determined. The ranked list of territories is sent to the marketing platform 1040 for presentation to the media IP asset managers/owners 1010. A budget allocation for each territory, as set by the media IP asset managers/owners 1010, is received and for each territory, the marketing campaign budget is optimized using the highest ranked geodemographic groups and associated metadata advertising interests or keywords corresponding to the given media IP asset and budget allocation set by the media IP asset managers/owners 1010. The optimized third-party advertising platform description is then sent to the marketing platform 1040.

In more detail FIG. 7A is a flow diagram depicting online audience generation by the online audience generation component 1850, which is depicted in FIG. 4A.

The online audience generation component 1850 contains a model selection component 1851 which selects and receives the category specific model from the offline model generation component 1820 (step S1840). The model selection component 1851 consists of a category specific aggregated geodemographic group consumption database, derived from the consumption database 1060 using the media IP asset and geodemographic group indices associated with the matrix C from the asset category clustering component 1821, and the relevant metadata of the media IP assets and the category specific geodemographic weights from the model truncation component 1822, along with the trained model $E_{est}=XY^T$ and input data E indexed by the sets I and J from the complete category model fitting subcomponent 1824*b*.

When a media IP asset $i_0$ and a marketing campaign goal are received from either the opportunity detection analytics hub 1070 or directly from a media IP asset manager 1010 via the marketing platform 1040 (step S1841), the online model selection component 1851 passes the marketing campaign goal along to the high growth potential audience identification component 1853 and also performs a dictionary look-up to check if the submitted media IP asset is present in the appropriate statistical model determined by the asset category clustering component 1821, i.e. whether or not $i_0 \in I$ for the appropriate category of media IP assets given its category assignment (step S1842). If $i_0 \in I$ then all relevant geodemographic group engagement information is already implicitly present in the trained, category specific model. If $i_0 \notin I$ additional steps, described in the next paragraph, must be taken. In a specific embodiment marketing campaign goals can emphasize a combination of three broad growth and re-engagement strategies: accelerating recent growth trends; expanding to new audiences for greater breadth; sustaining engagement with existing core audiences).

When $i_0 \notin I$ the online model selection component 1851 first sends the media IP asset to the online model update component 1852 which then sends a request to the consumption database 1060 to receive consumption for the geodemographic groups J used in the appropriate statistical model determined by the category associated with the media IP asset based on its cluster assignment in the asset category clustering component 1821, i.e. $V_{i_0j}$ for all $j \in J$ from which the engagement metrics $E_{i_0j}$ are determined as in the engagement metric component 1823.

Next, in step S1843, geodemographic engagement metrics for specified media IP asset(s) are appended to the engagement matrix, which is factored to produce an adapted trained online statistical model for the specified media IP asset(s). Specifically, the row vector $E_{i_0}$ corresponding to the geodemographic engagement metrics for $i_0$ is appended to the matrix $E_{est}$ to obtain a new (m+1)×n engagement matrix $E_{est}^*$. To obtain new factor matrices the matrices X and Y are updated by first replacing E with $E_{est}^*$ to generate an (m+1)×k matrix $\hat{X}$ and then replacing X with this new matrix along with $E_{est}^*$ to generate the n×k matrix $\hat{Y}$. This produces a new (m+1)×n factorization $\hat{X}\hat{Y}^T$ which is then used as the adapted trained online statistical model for the media IP asset $i_0$.

In step S1844, high growth potential audiences are identified using the trained online statistical model for the specified media IP asset. Specifically, the online model selection component 1851 or online model update component 1852 sends the appropriate trained online statistical model to the high growth potential audience identification component 1853, i.e. $E_{est}=XY^T$ in the case $i_0 \in I$ and $E_{est}=\hat{X}\hat{Y}^T$ when $i_0 \notin I$ where for notational convenience we denote the matrix $E_{est}$ by $\hat{E}$, and similarly we use X and Y to denote the factors of $\hat{E}$ hereafter. The latent factors of the model (or adapted model) are then used to make predictions for the engagement metrics for each geodemographic group in J.

In the conventional collaborative filtering context, the latent factors derived from a matrix factorization approach are used to derive predictions of individual preference for items that users have not engaged with yet. In contrast, in the process described herein and as a result of the sparsity constraints of the model truncation component 1822, there is observed engagement between most media IP assets and geodemographic groups which supports a different approach to the derivation of recommendations.

Specifically, as further seen in step S1844, training of the statistical models includes dividing geodemographic groups into multiple classes, such as class $J_\alpha$ associated with marketing campaign goals of audience expansion, class $J_\beta$ associated with marketing campaign goals of growth trend acceleration, and class $J_\gamma$ associated with marketing campaign goals of sustaining audience engagement. For each $$j \in J,\ \text{define } \Delta(i_0, j) := \hat{E}_{i_0 j} - E_{i_0 j}$$

and let $\mu_{i_0}$ and $\sigma_{i_0}$ denote the sample mean and standard deviation of {Δ(i_0,j)|j∈J} respectively. Then, in the high growth potential audience identification component 1853 for the media IP asset $i_0$ geodemographic groups are divided into three classes, class $J_\alpha$ consisting of geodemographic groups j such that $\Delta(i_0,j)\gg\mu_{i_0}+\sigma_{i_0}$ where class $J_\alpha$ is associated with marketing campaign goals of audience expansion, class $J_\beta$ consisting of geodemographic groups j such that $\Delta(i_0,j)\ll\mu_{i_0}-\sigma_{i_0}$ where class $J_\beta$ is associated with marketing campaign goals of growth trend acceleration, and lastly class $J_\gamma$ consisting of geodemographic groups j such that $\mu_{i_0}-\sigma_{i_0}\ll\Delta(i_0, j)\ll\mu_{i_0}+\sigma_{i_0}$ where class $J_\gamma$ is associated with marketing campaign goals of sustaining audience engagement.

Then, as further seen in step S1844, training of the statistical models includes calculating a goal-weighted predicted engagement score for each geodemographic group with respect to the specific media IP asset, on a per class basis. Specifically, using these class assignments a goal-weighted predicted engagement score $$\hat{E}^*_{i_0 j}$$

is calculated for each geodemographic group with respect to $i_0$. In a particular embodiment this is calculated as $$\hat{E}^*_{i_0 j} := (1+\rho\cdot 1_{j\in\Lambda})\cdot\max\left(\hat{E}_{i_0 j}, E_{i_0 j}\right)$$

where Λ encodes the marketing campaign goal, i.e. $\Lambda=J_\alpha$ if the marketing campaign goal is expansion, $\Lambda=J_\beta$ if the campaign goal is acceleration and $\Lambda=J_\gamma$ if the marketing campaign goal is sustaining engagement, ρ is a number between zero and one parameterizing how strongly alignment with the specified goal is prioritized. The validity of associating these different geodemographic groups with different marketing objectives is dependent on the effective clustering of the media IP assets and the model hyperparameter selection. The goal-weighted predicted engagement scores $$\hat{E}^*_{i_0 j}$$

are then sent to the territory identification subcomponent 1854*a* of the DSP audience generation targeting description component 1854.

Within the context of marketing campaigns for media IP assets on third-party advertising platforms, from the execution of a wide variety of marketing campaigns on behalf of the media IP asset managers/owners by the media asset distributor 1020 across genres, territory and dates, territory has emerged as a consistent and strong factor driving cost differences between campaigns. That is, while the precise cost to reach an individual user on third-party advertising platforms varies with respect to the internal ad-bidding algorithms, the variation within a single campaign across territory is consistently greater than the variation between geodemographic groups within these territories. Similarly, variation in DSP revenue per stream is strongly driven by territory.

Additionally, regardless of the overall marketing campaign optimization criteria provided to the third-party advertising platform (e.g., impressions, clicks, conversions, etc.), the internal bidding optimization algorithms of third-party advertising platforms will prioritize serving advertisements to users at the lowest possible cost to the advertiser. If marketing campaigns are not separated along territorial boundaries, then this has the effect of the bidding optimization algorithms preferentially allocating marketing campaign budget to the most cost-effective territories. This allocation may not be consistent with overall advertising strategy and specific marketing campaign objectives (e.g., if the marketing campaign objective is to grow the audience of a media IP asset in several new territories at once). Similarly, this allocation may not be the most effective with respect to ROI since the more cost-effective advertising territories may correspond to the territories where DSP revenue per stream is lower. This, along with differences in language between territories results in the minimal requirement that marketing campaigns be separated along territorial boundaries for the effective allocation of marketing budget within a campaign. In other embodiments this separation may be further refined along other geodemographic boundaries (e.g., age, gender).

Step S1845 identifies and ranks territories according to a weighted average of the goal-weighted predicted engagement score. Specifically, in the territory identification subcomponent 1854*a* let $J_T$ be the subset of geodemographic groups in J associated with a given territory T. Geodemographic groups in $J_T$ are ranked according to $$\hat{E}^*_{i_0 j},$$

with high growth potential geodemographic groups denoted by $J_T$*. Territories are then ranked according to a weighted average of the goal-weighted predicted engagement score $$\hat{E}^*_{i_0 j}$$

over the geodemographic groups in $J_T$*, using the geodemographic weights provided by the model truncation component 1822 of the offline model generation component 1820. The top ranked territories according to this weighted average, along with the subset of high growth potential geodemographic groups particular to each of these territories $J_T$* are then sent to the metadata interest identification subcomponent 1854*b*.

As an example, in a particular embodiment let $J_T^*\subseteq J_T$ be the top geodemographic groups of $J_T$ sorted by $$\hat{E}^*_{i_0 j}$$

chosen so that 1) the size or $J_T$* is as small as possible and 2) the sum of the geodemographic weights of the elements of $J_T$* exceeds a minimum threshold $\Sigma_{j\in J_T^*}\omega_j>\kappa$. Territories are then ranked according to $$S(T) := \frac{\Sigma_{j\in J_T^*}\omega_j\cdot\hat{E}^*_{i_0 j}}{\Sigma_{j\in J_T^*}\omega_j}$$

with the greatest such score denoted S*. Territories having their top ranked geodemographic groups satisfy $\hat{E}_{i_0 j}^*>S^*$ and the top ranked geodemographic groups associated with each of these selected territories, i.e. $J_T^*$, are then sent to the metadata interest identification subcomponent 1854*b*.

Then in the metadata interest identification subcomponent 1854*b* territory specific advertising interests or keywords are determined (step S1846). Here, the delta matrix $\Delta(i,j):=\hat{E}_{ij}-E_{ij}$ for all $i \in I \cup \{i_0\}$ and $j \in J$ is factored as the product of the m×m matrix $\Omega = X(X^T X+\lambda \cdot Id)^{-1}X^T - Id$ and the m×n matrix E using the factorization of $\hat{E}$. The media IP assets that give the largest positive contribution to the sum of the inner product of the $i_0$-th row of $\Omega$ and the j-th column of E most strongly inform the observed deltas $\{\Delta(i_0, j) | j \in J_T^* \cap J_\alpha\}$. The metadata (e.g., artists, subgenres, etc.) associated with these media IP assets are then collated and included as additional advertising interests or keywords in the initial advertising criteria on the appropriate third-party advertising platform for each territory.

In a specific embodiment, marketing campaign budget is set by the media IP asset owners/managers 1010 via the marketing platform 1040. The size of the budget at the territory level informs the optimal size of the initial geodemographic and interest targeting; when the predicted reach on the third-party advertising platform for a given geodemographic and interest description is too small then the cost per user will be higher and when the predicted reach is too large then the initial ads will not reach users likely to become highly engaged with the media IP asset.

| We have identified high growth potential audiences in the following territories. | Would you like to execute a marketing campaign in this territory? | How much would you like to spend (USD) on campaigns in each territory? |
|---|---|---|
| Brazil | Yes/No | $________ |
| US | Yes/No | $________ |

Use Case Illustration 1: Prompt for Territory Budget Allocation in Response to 1854*a*

The list of territories generated in the territory identification subcomponent 1854*a* is sent to the marketing platform 1040 to be presented to the media IP asset managers/owners 1010 where they are prompted to allocate marketing campaign budget on a territory by territory basis (step S1847). The territories' highest ranked geodemographic groups $J_T^*$ and associated metadata advertising interests or keywords corresponding to the given media IP asset and budget allocation set by the media IP asset managers/owners 1010 (step S1848) are then sent by the DSP audience generation targeting description component 1854 and the marketing platform component 1040 respectively to the marketing campaign budget optimization component 1855.

In step S1849, for each territory, the marketing campaign budget is optimized using the highest ranked geodemographic groups and associated metadata advertising interests or keywords corresponding to the given media IP asset and budget allocation set by the media IP asset managers/owners. Specifically, in the marketing campaign budget optimization component 1855, these DSP specific targeting descriptions are converted into a third-party advertising platform description. Using the initial budget size set by media IP asset managers/owners 1010, an estimated reach of users on third-party advertising platforms is calculated from this description through APIs with third-party advertising platforms 1100.

Maximum territorial budget limits based on estimated third-party advertising platform reach are set by a campaign analytics database 1121 in the offline campaign attribution analytics hub 1120. This campaign analytics database 1121 provides category and territory specific benchmarks of overall third-party advertising platform campaign metrics (e.g., cost per click) from the ratio between campaign budget and estimated third-party advertising platform reach and is updated on a regular cadence from past marketing campaign metrics.

The marketing campaign budget optimization component 1855 continually interacts with third-party advertising platforms 1100 through APIs and updates the third-party advertising platform description by adding or removing geodemographic groups $j \in J_T^*$ prioritized according to $\hat{E}_{i_0 j}^*$ to or from the DSP specific targeting descriptions and then converting these DSP specific descriptions to an appropriate third-party advertising platform description.

This process repeats until an acceptable estimated reach is obtained for each given territory and budget combination as determined by the campaign budget optimization model or until estimated reach can no longer be effectively expanded as there are no longer any high growth potential geodemographic groups available for a territory. If all available high growth potential geodemographic groups are used to generate the third-party advertising platform description before the lower bound on the required size of the estimated reach on third-party advertising platforms for a given budget is attained then the budget is reduced to the upper bound on the recommended budget size given that estimated reach and a notification is sent to the media IP asset managers/owners 1010 through the marketing platform component 1040.

| We have identified high growth potential audiences in the following territories. | Would you like to execute a marketing campaign in this territory? | How much would you like to spend (USD) on campaigns in each territory? |
|---|---|---|
| Brazil | Yes/No | ~~$1000~~ 800 |
| US | Yes/No | $1000 |

Use Case Illustration 2: Notification of Budget Change in 1855, reflecting that ad spend above $800 in this territory is unlikely to be effective and allocated budget has been reduced accordingly.

The online audience generation component 1850 then sends the third-party advertising platform description generated by the marketing campaign budget optimization component 1855 to the marketing platform 1040 (step S1850).

Marketing Platform 1040

Briefly, according to one aspect described herein, the marketing platform 1040 is configured to interact with the marketing action analytics hub 1080 and create marketing campaigns based around high growth potential audiences and suggest marketing actions to media IP asset managers and owners 1010 to advertise to audiences predicted to be strongly engaged with their media assets on appropriate marketing channels via targeted marketing campaigns, including receiving the ranked list of media assets and corresponding recommended marketing actions and their advertising platform descriptions of audiences for the media assets in the ranked list as well as a ranked list of auxiliary media assets from the marketing action analytics hub 1080.

Figure 5:
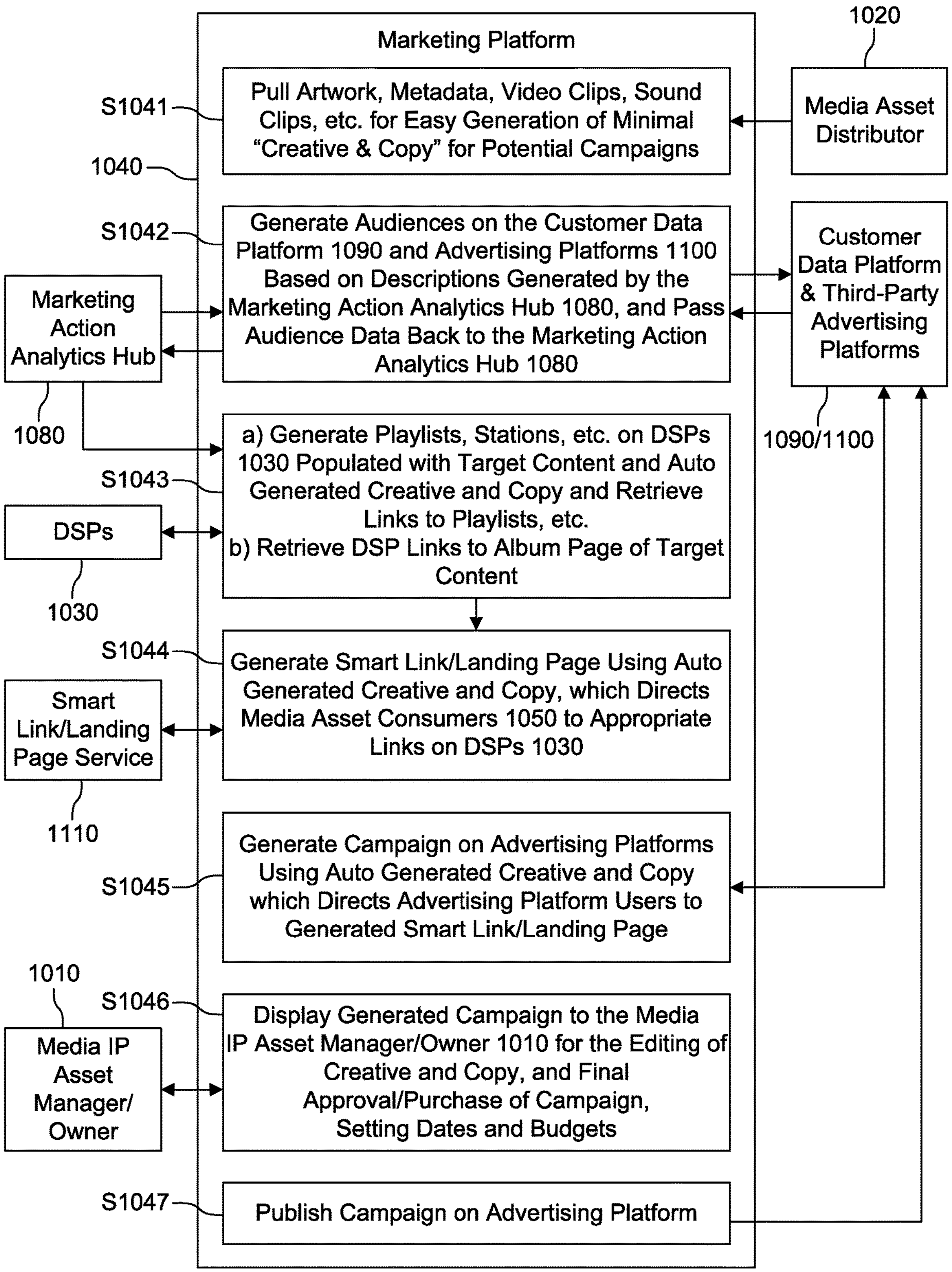
FIG. 5 is a schematic showing additional details of a marketing platform according to some embodiments of the disclosure.

In more detail, FIG. 5 is a schematic showing additional details of the marketing platform 1040 according to some embodiments of the disclosure. In a specific embodiment of the process, the receipt of vetted opportunities for a target media asset, coupled with media asset specific target audiences on each available advertising channel (e.g., direct via a customer data platform 1090 or through a third-party advertising platform 1100) from the marketing action analytics hub 1080, initiates the automatic generation of marketing campaigns for the potential purchase and execution by the target media IP asset managers/owners 1010.

In step S1041, in preparation for the potential generation of marketing campaigns, the media asset distributor 1020 sends promotional advertisement material, e.g., album art, sample sound/video clips, etc. to the marketing platform 1040 along with the media IP assets by the target media IP asset managers/owners 1010. In step S1042, when the marketing platform 1040 receives an audience description from the marketing action analytics hub 1080 (step S1850 in FIG. 7A), the marketing platform 1040 interfaces with the customer data platform 1090 and the associated third-party advertising platform 1100 via an API to retrieve details of the audience reachable on those platforms (the customer data platform 1090 and the associated third-party advertising platform 1100) determined by the given description. The marketing platform 1040 then passes details of the audience back to the marketing action analytics hub 1080 (marketing action evaluation 1086) for a final vetting of the opportunity (including the target media asset, coupled with the specific audience available on a given platform optimized for the particular media asset).

In step S1043, conditional on the receipt of a vetted opportunity from the marketing action analytics hub 1080, the marketing platform 1040 then interfaces with a DSP 1030 via an API to generate a playlist, station, etc. on the DSP 1030 featuring the target media asset along with additional auxiliary assets identified in the marketing action analytics hub 1080 (step S1085 in FIG. 4A). The marketing platform 1040 also interfaces with a DSP 1030 via an API to retrieve links to appropriate album or artist landing pages within the DSP client when the generation of playlists, stations, etc. is not a viable option for the particular DSP 1030.

In step S1044, the marketing platform 1040 interacts with a smart link and landing page service provider 1110 via an API to generate a landing page for the target media asset. This landing page directs media asset consumers 1050 to engage with the target media asset and auxiliary assets on the DSPs 1030 via the links retrieved in step S1043. In step S1045, the marketing platform 1040 interacts with the customer data platform 1090 and the third-party advertising platform 1100 via an API to generate campaigns on those platforms with vetted high ROI audiences (marketing action evaluation 1086 in FIG. 4A).

In step S1046, the marketing platform 1040 displays all generated campaigns to the manager/owner of the target media IP asset 1010 ranked in order of expected ROI, in a GUI which enables the manager/owner to inspect, edit, and set budgets and time frames and to make payments for the campaigns. In step S1047, conditional on authorization and payment by the media IP asset manager/owner 1010, the marketing platform 1040 interacts with the customer data platform 1090 and/or third-party advertising platforms 1100 via an API to publish the authorized campaign.

Campaign Attribution Analytics Hub 1120

Briefly, according to one aspect described herein, the campaign attribution analytics hub 1120 is configured to use data from the consumption database 1060, the marketing platform 1040, the customer data platform 1090, and third-party advertising platforms 1100 to accurately attribute the effect of a marketing campaign, including collecting new campaign specific trend data after a marketing campaign has been launched from the consumption database 1060 as soon as it is processed and made available for analysis.

Figure 6:
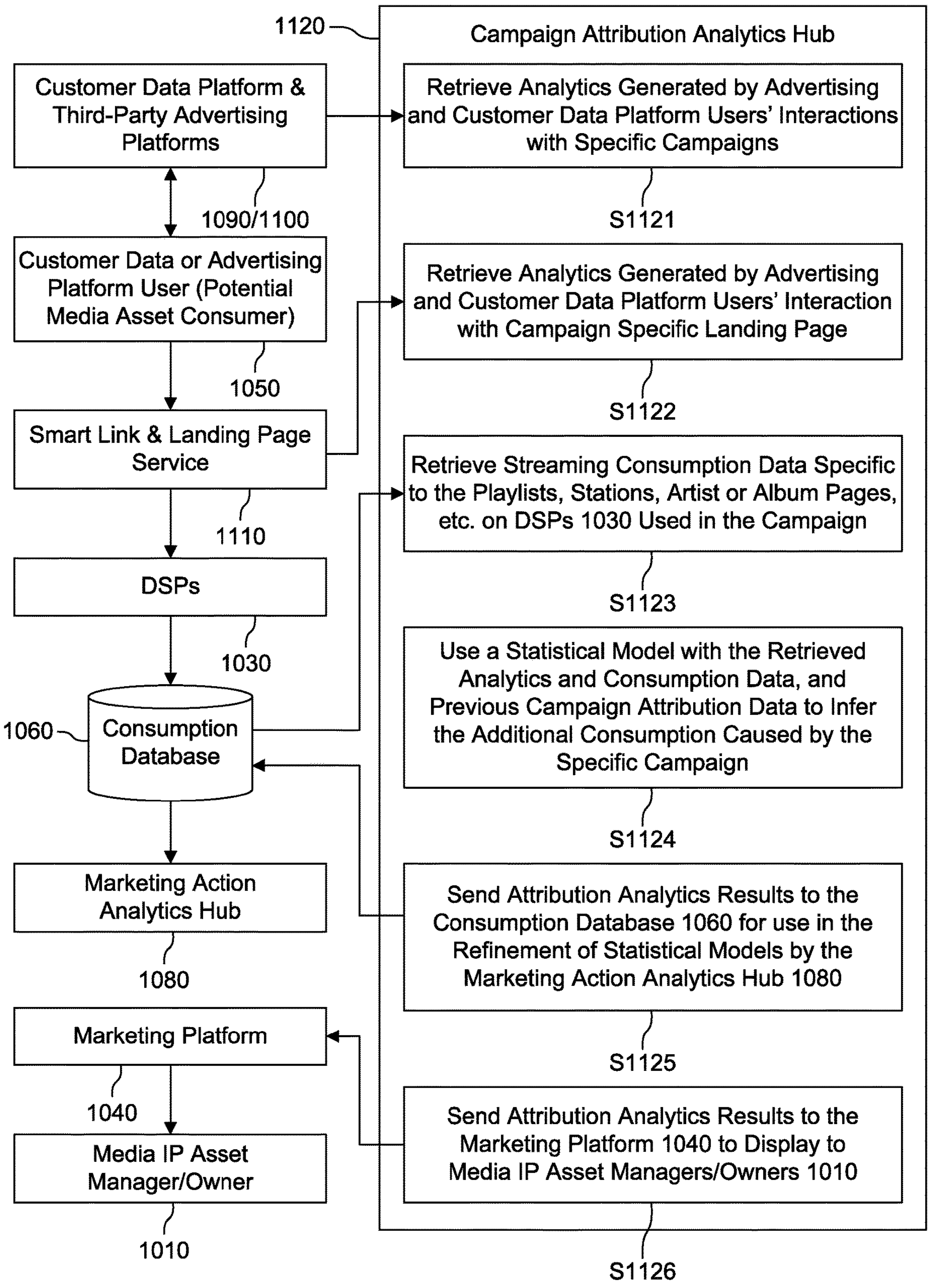
FIG. 6 is a schematic showing additional details of a campaign attribution analytics hub according to some embodiments of the disclosure.

In more detail, FIG. 6 is a schematic showing additional details of the campaign attribution analytics hub 1120 according to some embodiments of the disclosure. In a specific embodiment of the process, analytics data is pulled from a variety of sources to attribute the increase in streaming consumption caused by running the generated campaign authorized by the media IP asset manager/owner 1010 in step S1046 in FIG. 5, and published in step S1047 in FIG. 5.

In step S1121, the analytics generated by customers in the customer data platform 1090 and/or users of third-party advertising platforms 1100 interacting with the campaign are pulled from these platforms to the campaign attribution analytics hub 1120. In step S1122, the analytics generated by interactions with the landing page(s) generated specifically for the campaign (step 1044 in FIG. 5) are pulled to the campaign attribution analytics hub 1120. In step S1123, the consumption data relevant to the campaign, i.e., the data corresponding with the consumption on the DSPs related to the links retrieved and generated in step S1043 of FIG. 5, is retrieved from the consumption database 1060.

In step S1124, the campaign attribution analytics hub 1120 uses a statistical model in conjunction with the data retrieved in steps S1121-S1123 to infer the increases in streaming consumption directly caused by the campaign. In step S1125, the campaign attribution analytics hub 1120 sends the results of the attribution analysis to the consumption database 1060 for storage and later use in the refinement of models which are then used by the marketing action analytics hub 1080.

In step S1126, the campaign attribution analytics hub 1120 sends the results of the attribution analysis to the marketing platform 1040 for display to the media IP asset managers/owners 1010.

In a specific embodiment of the system and process schematically illustrated in FIG. 6, analytics data is pulled from a customer data platform 1090 and third-party advertising platforms 1100 and combined with the relevant campaign consumption data from the consumption database 1060 in the campaign attribution analytics hub 1120 (steps S1121-S1123).

In step S1124 a forecast model is trained to predict the background discovery and re-engagement rates within the streaming context of the media asset links on the DSPs (e.g., playlist or album page) associated with the marketing campaign. The model is trained to utilize cross correlations between the streaming context of the associated media asset link and other engagement contexts both within the same DSP as well as on other DSPs to control for exogenous increases in streaming which are not directly caused by marketing efforts. Let $D_t$ and $R_t$ denote the multivariate discovery and re-engagement event time series of the target content corresponding with the associated media asset links respectively; let $C_t$ denote the multivariate time series of ad-campaign click events directing media asset consumers 1050 to the target content via the associated media asset links; and let $A_t$ denote the multivariate auxiliary time series of discovery and re-engagement events occurring within all other streaming contexts and on all other DSPs excepting those which media asset consumers 1050 are directed to via the associated media asset links. Then a prediction model $$\hat{D}_{t:t+p}, \hat{R}_{t:t+p} \sim N(\mu,\sigma) \sim f(D_{t-q:t-1}, R_{t-q:t-1}, A_{t-q:t+p}, C_{t-q:t+p})$$

is fit using the historical consumption features described above, where p is the campaign duration, q delineates the lagged features used as inputs to the model and the model f is operationalized as a gated convolutional neural network, trained by minimizing approximate cross entropy loss. This allows for the robust inference of the causal impacts of the ad-campaign discovery and re-engagement with the target content.

Examples

In the following example usage scenario, a media IP asset manager/owner 1010 and customer of a distribution service has distributed ~1 k sound recordings through the digital media asset distributor 1020 over several years as a customer of this distributor. The opportunity detection analytics hub 1070, occurs automatically from the perspective of the media IP asset manager, scanning each of these ~1 k media assets daily to detect statistically significant shifts in the streaming consumption and UGC interaction patterns of a media IP asset.

When a significant shift is detected in UGC interactions associated with a media IP asset in the significant change detection component 1071 of the online opportunity detection component 1075 while no significant shifts are currently present in active streaming consumption, the media IP asset is sent to the online model prediction component 1074. When the online model prediction component 1074 predicts that one or more media IP assets will experience significant growth in active streaming consumption on DSPs and the online opportunity detection component 1075 classifies the opportunity as worthwhile, the positive prediction is sent to the marketing action analytics hub 1080 where an automated push notification/email is generated and sent to the media IP asset manager/owner 1010 which alerts them to the fact that worthwhile marketing opportunities on active streaming DSPs exist for the media IP asset associated with the significant growth in UGC interactions. The alert provides a link which enables them to log into a GUI in the marketing platform 1040. This GUI serves as the interface for the media IP asset manager/owner 1010 with the services provided by the opportunity detection analytics hub 1070 and the marketing action analytics hub 1080.

Upon logging into this marketing platform 1040, the media IP asset manager/owner 1010 is presented with a list of media IP assets under their management with marketing opportunity messages related to specific detections of signification change and/or predictions of significant growth on active consumption channels. FIG. 9 shows an example GUI for a list of media assets and the marketing opportunity messages that may be presented to them.

Architecture

Figure 10:
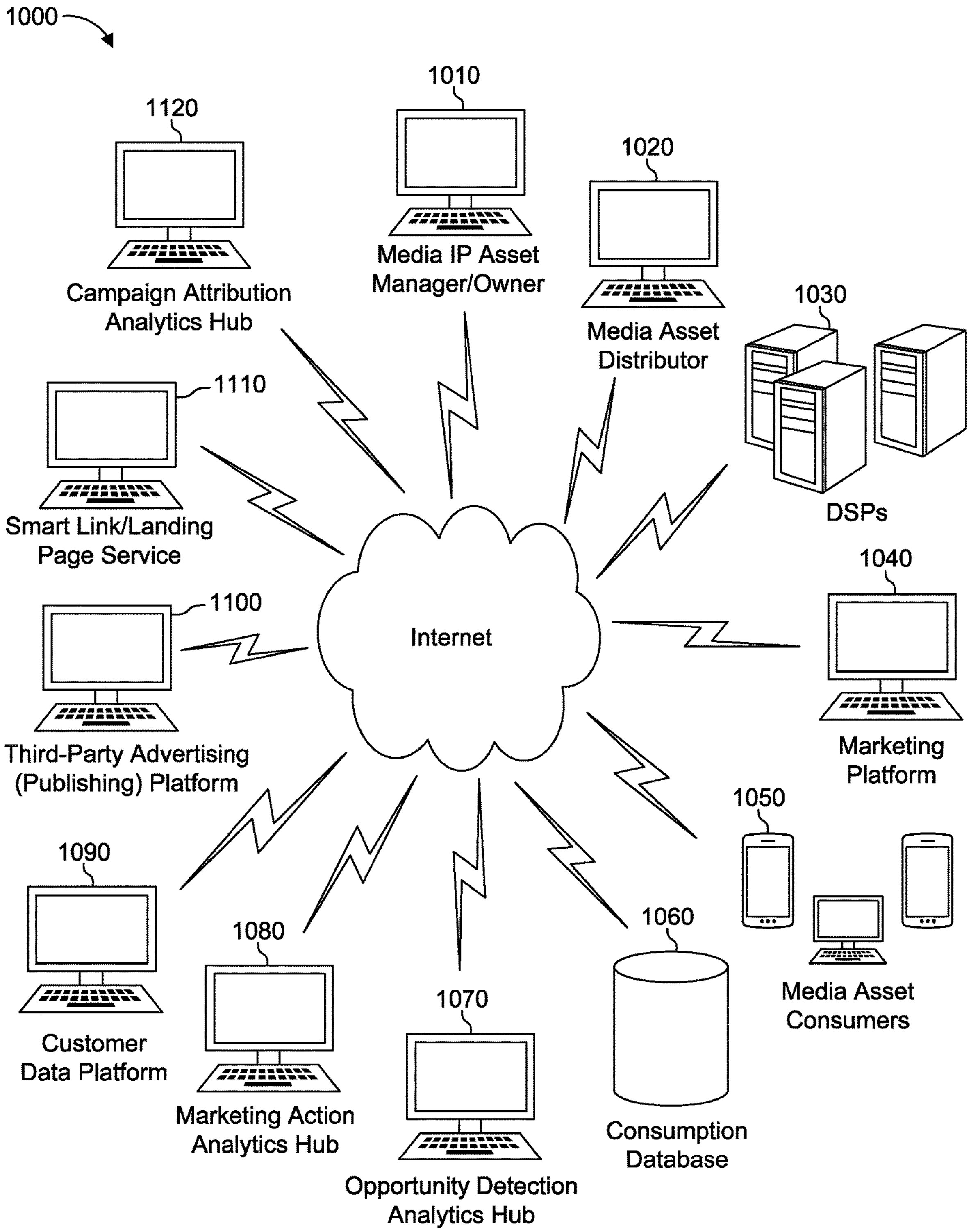
FIG. 10 is a schematic showing example architecture of the marketing analytics pipeline according to some embodiments of the disclosure.

FIG. 10 is a schematic showing example architecture of the marketing analytics pipeline 1000 according to some embodiments of the disclosure. The marketing analytics pipeline 1000 can be implemented by a plurality of computing devices. The computing devices may include, for example, personal computers, network computers, game consoles, work stations, application servers, databases, and personal communication devices. The computing devices may communicate with each other via the internet. The computing devices may be dedicated "hard-wired" devices, or programmable devices. Each of the computing devices shown in FIG. 10 may be an integrated unit or may be implemented using a plurality of distributed computing devices.

Each of the computing devices may include one or more processors, computer-readable memory media, and a memory. The processors may operate to execution instructions stored in the memory. The computer-readable memory media, for example, hard disk drives, store computer-executable instructions that implement the methods described above. The computing devices may include input and output devices, such as a keyboard, a mouse, and a monitor, for example. Each computing device may include a network interface that enables the computing device to connect to the internet, and communicate with other computing devices in the marketing analytics pipeline 1000.

The embodiments illustrated and discussed in this specification are intended only to teach those skilled in the art how to make and use the disclosure herein. In describing embodiments of the disclosure herein, specific terminology is employed for the sake of clarity. However, the disclosure herein is not intended to be limited to the specific terminology so selected. The above-described embodiments of the disclosure herein may be modified or varied, without departing from the disclosure herein, as appreciated by those skilled in the art in light of the above teachings. It is therefore to be understood that, within the scope of the claims and their equivalents, the disclosure herein may be practiced otherwise than as specifically described.

The invention claimed is:

1. A method for authorizing execution of targeted marketing campaigns for streaming media intellectual property (IP) assets, the method comprising:

- streaming, by media asset consumers, media IP assets distributed to digital service providers (DSPs) via a media asset distributor, for which the consumers have obtained streaming access through subscription or agreement to other terms of use from the DSPs;
- interacting, by social media users, with user generated short-form video content (UGC) on social media platforms, wherein the user generated short-form video content may incorporate a plurality of media IP assets;
- documenting and compiling both of context-specific audience behaviors relating to said streaming of media IP assets by the consumers together with the UGC interactions of the social media users which are synthesized into trend data reports, wherein items in the trend data reports comprise specific media IP assets;
- implementing a marketing analytics pipeline by:
  - receiving or retrieving the trend data reports from the DSPs and the social media platforms, wherein the trend data reports are received or retrieved using a reporting tool API (application programming interface) that provides an interface between said DSPs and the social media platforms and a consumption database controlled by the media asset distributor,
  - compiling the context-specific audience behaviors of the consumers and the UGC interactions of the social media users from the trend data reports into specific geodemographic groups including geographic regions, genders, ages and DSP subscription status, and without identification of individual consumers and separated into active and passive engagement and UGC interaction contexts for both the DSPs and the social media platforms respectively,
  - creating a ranked list of one or more media IP assets and corresponding marketing actions based on the context-specific audience behaviors of the consumers and the UGC interactions of the social media users,
  - retrieving links on the DSPs for the one or more media IP assets in the ranked list of one or more media IP assets, the links being retrieved by use of an API of an associated DSP and/or a smartlink API, wherein the API of the associated DSP may or may not include the reporting tool API, creating for each media IP asset in the ranked list of one or more media IP assets, using the smartlink API, one or more landing pages comprising associated links on the DSPs, and creating marketing campaigns through an advertising API that interacts with online advertising platforms, wherein the marketing campaigns are created for media IP asset managers/owners and include the one or more landing pages comprising the associated links on the DSPs for each of the one or more media IP assets in the ranked list;

presenting the ranked list of one or more media IP assets, the corresponding marketing actions, and the marketing campaigns to the media IP asset managers/owners in a graphical user interface (GUI), wherein the GUI includes a media IP asset and a corresponding listing of marketing campaigns, and wherein the GUI enables the media IP asset managers/owners to manage funds, set territory specific budgets and upload, store and select audio and visual promotional advertisement material to use as creative and copy for the marketing campaigns;

receiving modifications of the funds, the territory specific budgets and the audio and visual promotional advertisement material made via the GUI by the media IP asset managers/owners; and receiving authorization to execute the marketing campaigns from the media IP asset managers/owners, wherein the marketing analytics pipeline is further implemented by:

an opportunity detection analytics hub which uses the trend data reports from the consumption database to fit statistical models based on streaming consumption and social media UGC interaction patterns of an entirety of distributed media IP assets on a regular cadence and send growth and re-engagement opportunities on to a marketing action analytics hub where high growth potential audiences can be identified; and a marketing platform which interfaces through the advertising API that interacts with the online advertising platforms, and which interacts with the marketing action analytics hub to create targeted marketing campaigns based around the high growth potential audiences, the marketing platform further suggesting marketing actions through the GUI on an online platform and/or push notification alert system to the media IP asset managers/owners of the one or more media assets in the ranked list, wherein the marketing actions are designed for delivery to the high growth potential audiences on marketing channels via the targeted marketing campaigns;

wherein the opportunity detection analytics hub is comprised of an offline prediction model generation component and an online opportunity detection component that receives both current streaming consumption and social media UGC interaction data for the plurality of media IP assets and identifies opportunities from a combination of the current streaming consumption and the social media UGC interaction data that could not be detected if analyzed separately, inclusive of a case where significant changes are detected in the social media UGC interaction patterns, but are not yet detected in the streaming consumption;

wherein the offline prediction model generation component is configured to model the context-specific audience behaviors as daily counts of streams and to model the UGC interactions for the media IP assets by considering the UGC interactions as noisy measurements of a latent multivariate state vector z consisting of level l, trend b, and periodic offset s components and by employing a dynamic Bayesian network where explicitly modeling the posterior distribution of the trend b enables detection of gradual significant changes by recursively calculating a probability that the trend b significantly deviates from zero where an output is compiled in a time series tensor $\tilde{C}_{x_i,f_j,t_k} := \langle v, l, b, d \rangle_{x_i,f_j,t_k}$ where for an i-th media IP asset $x_i$ and the j-th streaming engagement/social media UGC interaction context $f_j$ and the k-th date $t_k$ daily counts are represented as v along with the level l, the trend b and cumulative indicator feature d which documents a time t (in number of days) where the trend b significantly deviates from zero and indicates a significant growth status for a combination of $x_i$ and $f_j$ which are then compiled in a scalar feature matrix X and a target vector y where a subset of UGC interaction contexts S* are used for determining a set of media IP assets and days that generate rows of the scalar feature matrix X, which for the media IP asset $x_i$ are constructed by a largest nonnegative integer $k_i \geq 0$ such that for $0 \leq r \leq k_i$ there exists an $f_j \in S^*$ such that $d>0$ in a time series tensor $\tilde{C}_{x_i,f_j,t_r}$ for the time $t_r$ and a target vector y is constructed from a function h which takes as input extracted features in the time series tensor $\tilde{C}_{x_i,f_j,t_r}$ that are associated with data from the streaming DSP consumption state vectors and the rows that are associated with the times $t_r+1, \ldots, t_r+\Delta$ where $\Delta$ is a global parameter that does not depend on a choice of $x_i$ or $f_j$ as arguments by a feature engineering component of the offline prediction model generation component.

2. A marketing analytics pipeline and opportunity detection analytics hub according to claim 1, wherein the offline prediction model generation component is comprised of an offline model training component that employs a binary classification model adapted to a use case of opportunity detection within a marketing analytics pipeline where model performance is evaluated according to a standard $F_\beta$ score by a choice of parameter $\beta$ that is predetermined and is informed by minimizing false positive predictions while still allowing for a significant number of true positive predictions and model features are engineered by a set of functions $g_1(\tilde{C}_{x_i,f_j,t_r}), \ldots, g_m(\tilde{C}_{x_i,f_j,t_r})$, that map a combination of level, trend and significant growth status extracted feature contexts to a set of transformed and engineered features and the target vector is constructed from the function h which receives future streaming consumption events as inputs and both are mapped to real-values to describe relationships between the UGC interactions and streaming engagement contexts that classify cases where detections of significant growth in the UGC interactions are predicted to be followed by at least one detection of significant growth in active streaming consumption on the DSPs as either potential marketing opportunities with associated marketing campaign goals or non-opportunities using a statistical model applied to additional engagement metrics in the trend data reports and classify cases where the detections of significant growth in the UGC interactions are predicted to not be followed by any detections of significant growth in active streaming consumption on the DSPs as non-opportunities.

3. A marketing analytics pipeline and opportunity detection analytics hub according to claim 1, wherein the online opportunity detection component is comprised of an online model prediction component that for a respective media IP asset takes as input a vector of engagement and interaction contexts which are transformed and combined according to the feature engineering component and applies a model trained in the offline prediction model generation component to generate a model-specific outcome for a binary outcome prediction where the online model prediction component sends an alert to the marketing action analytics hub in a case of a positive outcome of predicted growth in streaming consumption for the respective media IP asset and is prioritized to avoid sending false alerts to the marketing action analytics hub where the marketing action analytics hub also receives a ranked list of media assets corresponding to positive outcome predictions that is presented along with corresponding marketing actions to the media IP asset managers/owners by the marketing platform in the graphical user interface (GUI).

* * * * *